United States Patent
Minoura et al.

(10) Patent No.: US 6,898,018 B2
(45) Date of Patent: May 24, 2005

(54) LUMINOUS DISPLAY ELEMENT

(75) Inventors: Kiyoshi Minoura, Tenri (JP); Shun Ueki, Nara (JP); Masahiko Tomikawa, Funabashi (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/900,213

(22) Filed: Jul. 28, 2004

(65) Prior Publication Data

US 2005/0006999 A1 Jan. 13, 2005

Related U.S. Application Data

(62) Division of application No. 09/970,821, filed on Oct. 5, 2001, now Pat. No. 6,787,976.

(30) Foreign Application Priority Data

Oct. 18, 2000 (JP) ........................................ 2000-318328
Jul. 27, 2001 (JP) ........................................ 2001-228581

(51) Int. Cl.$^7$ ........................... G02B 27/10; G02B 6/26; G02F 1/03; G02F 1/1335; H01J 5/16
(52) U.S. Cl. ..................... 359/627; 359/529; 359/263; 359/836; 385/18; 313/110; 313/113; 313/504; 313/506; 349/63; 349/69; 349/106; 428/690; 257/72; 204/192.15
(58) Field of Search ............................ 359/627, 529, 359/530, 263, 625, 836; 385/18; 313/110, 113, 500, 504, 506; 349/63, 67, 65, 69, 113, 106; 428/690, 332; 257/72, 59; 204/192.15

(56) References Cited

U.S. PATENT DOCUMENTS 3,905,682 A 9/1975 Meyerhofer
3,944,835 A 3/1976 Vosburgh ................. 250/487.1
4,816,714 A 3/1989 Walsh ........................ 313/111
4,992,699 A 2/1991 McClure et al. ............ 313/525
5,132,841 A 7/1992 Bennett et al. ............. 359/529

(Continued)

FOREIGN PATENT DOCUMENTS

JP 54-105998 A 8/1979
JP 3-186816 A 8/1991

(Continued)

OTHER PUBLICATIONS

U.S. Appl. No. 09/970,821 filed Oct. 5, 2001.
Shomoda et al, "26.2: Invited Paper: Current Status and Future of Light–Emitting Polymer Display Driven by Poly–Si TFT", SID 99 Digest, 1999, pp. 372–375.

(Continued)

Primary Examiner—Loha Ben
(74) Attorney, Agent, or Firm—Nixon & Vanderhye P.C.

(57) ABSTRACT

In a luminous display element, a retro-reflector is provided on the back side of an organic EL layer which includes an emission layer whose state changes between an emission state and a non-emission state. The retro-reflector includes a corner cube array, and reflects incident light in the same direction as an incident direction. A unit structure of the corner cube array is a form of a triangular pyramid which is made up of rectangular equilateral triangles having three faces, and a light shielding process is performed on the periphery of a base angle of the rectangular equilateral triangle. Thus, it is possible to prevent an image from being reflected, so that it is possible to provide the luminous display element whose contrast ratio and the utilization efficiency of emission are high.

6 Claims, 24 Drawing Sheets

U.S. PATENT DOCUMENTS

| | | | | |
|---|---|---|---|---|
| 5,182,663 | A | | 1/1993 | Jones |
| 5,315,491 | A | | 5/1994 | Spencer et al. ............... 362/84 |
| 5,929,956 | A | | 7/1999 | Neijzen et al. ............. 349/113 |
| 5,940,212 | A | | 8/1999 | Johnson et al. ............. 359/529 |
| 5,990,617 | A | | 11/1999 | Kanae et al. ............... 313/582 |
| 6,140,768 | A | | 10/2000 | Kim .......................... 313/584 |
| 6,142,643 | A | | 11/2000 | Araki et al. .................. 362/84 |
| 6,215,920 | B1 | * | 4/2001 | Whitehead et al. ........... 385/18 |
| 6,324,011 | B1 | | 11/2001 | Higuchi ...................... 359/627 |
| 6,337,381 | B1 | | 1/2002 | Biebuyck et al. ............. 528/12 |
| 6,366,017 | B1 | | 4/2002 | Antoniadis et al. ......... 313/506 |
| 6,384,979 | B1 | * | 5/2002 | Whitehead et al. ......... 359/619 |
| 6,452,734 | B1 | * | 9/2002 | Whitehead et al. ......... 359/836 |
| 6,551,725 | B2 | * | 4/2003 | Raychaudhuri et al. ..... 428/690 |
| 6,558,820 | B2 | * | 5/2003 | Raychaudhuri et al. ..... 428/690 |
| 6,627,332 | B2 | | 9/2003 | Utsugi et al. ............... 428/690 |
| 6,657,766 | B2 | * | 12/2003 | Minoura et al. ............ 359/263 |
| 2001/0040717 | A1 | | 11/2001 | Minoura et al. ............ 359/263 |

FOREIGN PATENT DOCUMENTS

| | | |
|---|---|---|
| JP | 7-205322 A | 8/1995 |
| JP | 8-321381 A | 12/1996 |
| JP | 2692671 B2 | 9/1997 |
| JP | 2773720 B2 | 4/1998 |
| JP | 11-7008 A | 1/1999 |
| JP | 11-174214 | 7/1999 |
| JP | 2991183 B2 | 10/1999 |
| JP | 2000-40584 A | 2/2000 |
| KR | 2000-0053127 | 8/2000 |
| WO | WO 98/20375 | 5/1998 |

OTHER PUBLICATIONS

Gu et al, "14.2: Novel Transparent Organic Electroluminescent Devices", SID 96 Digest, 1996, pp. 185–187.

U.S. Appl. No. 09/821,686, filed Mar. 30, 2001 entitled "Reflective Display Device and Retro–Reflector Used Thereof".

Korean Office Action mailed Aug. 6, 2004 (w/English translation thereof).

* cited by examiner

RETRO-REFLECTING SECTION

NON-RETRO-REFLECTING SECTION

CENTRAL AXIS

TOP VIEW

TOP VIEW

TOP VIEW

TOP VIEW

LUMINOUS DISPLAY ELEMENT

This application is a Divisional of application Ser. No. 09/970,821 filed Oct. 5, 2001, now U.S. Pat. No. 6,787,976, the entire content of which is hereby incorporated herein by reference in this application.

FIELD OF THE INVENTION

The present invention relates to a luminous display element which displays by using lumination therein.

BACKGROUND OF THE INVENTION

An organic electroluminesence display element (hereinbelow referred to as organic EL display element) is an extremely thin, self-light-emitting element. Compared with liquid crystal display elements which are spreading as thin, full-color display elements widely, this organic EL display element is superior in a view angle and speed of response. In this way, it is possible to display at high level, so that the luminous display element such as the organic EL display element is being developed actively so as to be applied to a high-quality display.

The organic EL display element is arranged by providing an organic electroluminesence layer (hereinbelow referred to as organic EL layer) between a transparent electrode provided on the front side and a metal electrode provided on the back side. The organic EL layer is made up of plural thin films such as a hole injection layer, a hole transport layer, an emission layer, an electron transport layer, and an electron injection layer. These plural thin films are formed sequentially by vacuum evaporation method or sputtering method, and deposited on a transparent substrate of the front side on which the transparent electrode is provided. Further, a method by which the thin films are formed by printing at low cost is proposed recently.

In this way, the organic EL display element is generally made up of at least one organic EL layer and a pair of electrodes, and an electron is injected from an electrode and a hole is injected from another electrode. A recombination of the injected electron and the injected hole causes the emission layer to emit light.

Although the organic EL display element is a promising art as a flat panel display, at the same time, it has problems associated with luminance of a material which makes up the organic EL layer, improvement of emitting efficiency, and life-lengthening etc. A conventional organic EL display element, for example, employs the following structure.

A luminous polymer display is described in "Society for Information Display '99 Digest" (pp. 372–375) (prior art (1), published in 1999). In this document, a flat display which has high resolution,' a wide view angle, high contrast ratio, and high speed of response is realized by combining a thin transistor made of polycrystal silicon and a luminous polymer.

However, when an incident angle of light which is incident on a substrate on the side of an observer from which the light emerges, and on an electrode through which the light passes is over a critical angle, the light which is emitted from the organic EL layer such as the luminous polymer is totally reflected, so that the light emitted in the organic EL display element emerges less efficiently. Thus, in order that the light emerges more efficiently, the organic EL display element employs the following structure.

Japanese Patent No. 2692671 (prior art (2), publication date: Sep. 5, 1997) discloses a resonator type organic thin film EL element. In the publication, it is described that the light which is emitted from the organic EL layer emerges more efficiently by providing a resonator such as a multilayer film reflecting mirror.

Further, Japanese Unexamined Patent Publication 2773720 (prior art (3), publication date: Apr. 24, 1998) discloses an organic thin film EL element. In the publication, it is described that the emitted light emerges more efficiently by providing a lens on the light-emerging side of a substrate.

Further, Japanese Unexamined Patent Publication 2991183 (prior art (4), publication date: Oct. 15, 1999) discloses an organic EL display element in which a diffraction grating and a zone plate are provided. In the publication, it is described that the emitted light emerges more efficiently by providing the diffraction grating and the zone plate.

Further, "Society for Information Display '99 Digest" (pp. 185–187)(prior art (5)) discloses an organic electroluminesence device in which three organic EL layers are deposited. In this document, it is described that high resolution can be realized by depositing the organic EL layers in three-phase. However, it is required to deposit a transparent organic EL layer as the second layer from the front side in order to deposit three organic EL layers. Thus, when the electroluminesence device does not emit light, 60% to 80% of transmittance of light is realized by depositing extremely thin metal electrodes. Although the extremely thin metal electrode brings about a high resistance value, an ITO is deposited on the metal electrode so that the resistance value is low.

Further, ambient light which is incident on the organic EL display element is reflected in the electrode. When the reflected light is reflected in a direction of an observer, an image is reflected on the organic EL display element. In order to prevent the reflection of an image, the organic EL display element employs the following structure.

In Japan Unexamined Patent Publication 2000-40584 (prior art (6), publication date: Feb. 8, 2000), there is a description of an organic EL display element in which it is possible to prevent reflection of an image due to mirror reflection of the metal electrode by providing irregularities on the transparent electrode, the metal electrode, and the organic EL layer.

Further, in Japan Unexamined Patent Publication No. 321381/1996 (Tokukaihei 8-321381) (prior art (7), publication date: Dec. 3, 1996), there is a description of an organic electroluminescence which can absorb the ambient light which passes through the organic EL layer and is reflected by the metal electrode by providing a polarizing film on a front surface of the organic electroluminescence. Thus, it is possible to prevent reflection of an image due to mirror reflection of the metal electrode, and prevent degradation of contrast ratio.

Further, Japan Unexamined Patent Publication 205322/1995 (Tokukaihei 7-205322)(prior art (8), publication date: Aug. 8, 1995) discloses an electroluminescence display element. In a structure described in the publication, a function which reflects the incident light in an incident direction (retro-reflection) is provided by providing a micro-corner cube array which is made of minute protrusions in a form of a triangular pyramid. Thus, even when the ambient light is incident, it is reflected in a direction of a light source, so that the ambient light does not disturb observation of an observer. Thus, reflection of an image in the electroluminescence display element is prevented.

However, generally, a thickness of an EL layer is not more than 200 nm. In this way, the EL layer is extremely thin, so that most of the ambient light passes through the organic EL layer of the prior arts (1), (2), (3), (4), and (5). The metal electrode is flat, so that a surface of the metal electrode is like a mirror. Therefore, the ambient light having passed through the organic EL layer is reflected by the metal electrode and is emitted to outside of the display element. Thus, like a mirror, reflection of an image occurs in the organic EL display element, so that a visibility of display is much spoiled. Further, when the strength of the ambient light such as outdoor light is larger than the strength of the light in the organic EL layer, contrast ratio much degrades.

In the prior art (6), irregularities in a form of dots are provided on the transparent substrate at random, so that it is possible to suppress a degradation of a visual quality due to the reflection of an image which is brought about by the ambient light. However, ambient light is reflected by the metal electrode also in a direction of an observer, so that contrast ratio of display degrades.

Further, techniques for preventing the reflection of an image brought about by the ambient light and the degradation of the contrast ratio includes a technique by which reflectance ratio of the metal electrode is dropped, and a technique by which, as disclosed in the prior art (7), a polarizing film and a quarter wavelength retardation film are provided on a front surface of the organic electroluminescence so that the polarizing film absorbs the reflected the ambient light. However, by these techniques, the metal electrode and the polarizing film absorb the light which is emitted by the organic EL layer, so that utilization efficiency of emission declines.

In a structure of the prior art (8), the display device is provided with a corner cube array whose unit structure is a form of a triangular pyramid. The corner cube array is not packed in the closest manner, so that it is required to keep the ambient light away from a portion which has no corner cube array. Even if the closest packing is performed, when the corner cube array whose unit structure is a form of a triangular pyramid is used as it is, there exists a portion which has no retro-reflectivity (non-retro-reflective portion). The ambient light which is reflected by this portion spoils a black state of a display device, so that contrast ratio degrades.

Further, the corner cube array is provided on the front side with respect to the EL layer. By this, a portion which has retro-reflectivity (retro-reflective portion) shields the light which is emitted in the back side, so that the light is shielded in two-thirds of an area of the corner cube array, so that utilization efficiency of emission degrades. Further, when a light shielding process etc. is performed on the non-retro-reflective portion of the corner cube array so that the ambient light is not reflected by the non-retro-reflective portion, the light emitted from the EL layer cannot emerge toward the side of an observer.

Thus, by the techniques of the prior arts, it is impossible to obtain a luminous display element which does not allow an image to be reflected, and has high contrast ratio of display and high utilization efficiency of emission.

SUMMARY OF THE INVENTION

The main object of the present invention is to provide a luminous display element in which it is possible to prevent an image from being reflected, and contrast ratio and utilization efficiency of emission are high.

The luminous display element of the present invention, in order to solve the foregoing problems, includes, on a back side of an emission layer, an optical member which reflects the incident light in the same direction as an incident direction.

According to the structure, it is possible for the light emitted in the emission layer to emerge to the front side of the luminous display element. Thus, it is possible to realize high lightness and good quality in a white state. Further, it is possible to allow not only the light which is emitted in the emission layer toward the front side, but also the light which is emitted toward the back side to emerge, so that it is possible to improve utilization efficiency of emission.

Further, it is possible to reflect the ambient light in the same direction as the incident direction by providing the optical member. Thus, for example, contrast ratio of a display device which uses the luminous display element becomes high. Also in a non-emission state, it is possible to reflect the ambient light in the same direction as incident light by providing the optical member, so that the ambient light does not emerge in a direction of an observer. As a result, an image is not reflected, so that it is possible to realize good quality in the black state. Thus, it is possible to provide the luminous display element whose contrast ratio is high.

Further, the luminous display element of the present invention includes the emission layer whose state changes between the first state which is an emission state and the second state which is a non-emission state; and a reflecting member which reflects the light emitted from the emission layer, wherein when the emission layer is in the second state, the reflecting member is adapted to reflect an image of a black part of an observer's eye so as to realize a black state as the observer recognizes the image of the black part of his/her eye.

According to the structure, it is possible for the light emitted in the emission layer to emerge to the front side of the luminous display element in the first state which is an emission state of the emission layer. Thus, it is possible to realize high lightness and good quality in the white state. Further, it is possible to allow not only the light which is emitted in the emission layer toward the front side, but also the light which is emitted toward the back side to emerge, so that it is possible to improve utilization efficiency of emission.

Further, when the emission layer is in the second state, an image of a black part of an observer's eye is reflected by including the reflecting member, and the observer recognizes the image of the black part of the eye, so that it is possible to realize the black state. Thus, it is possible to improve contrast ratio of a display device which uses the luminous display element.

For a fuller understanding of the nature and advantages of the invention, reference should be made to the ensuing detailed description taken in conjunction with the accompanying drawings.

DESCRIPTION OF THE EMBODIMENTS

[First Embodiment]

One embodiment of the present invention is described as follows based on FIG. 1 to FIG. 18(b).

Figure 1:
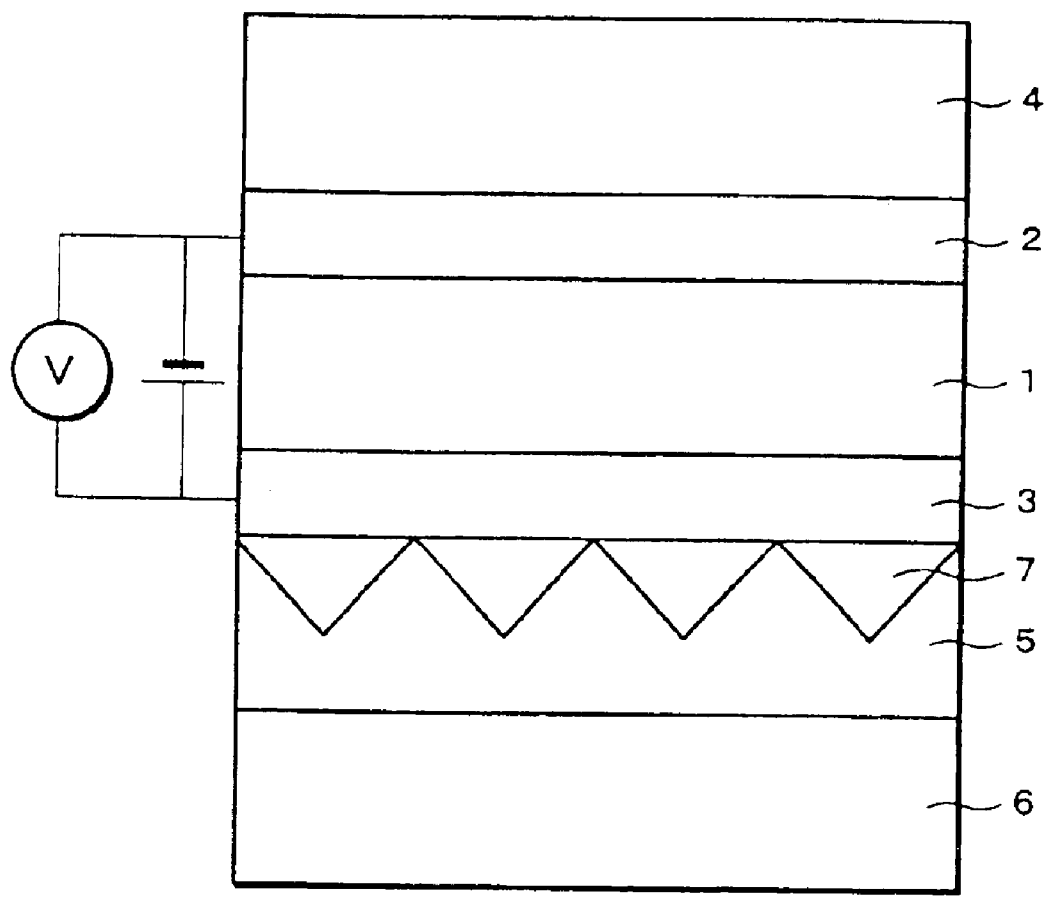
FIG. 1 is a cross sectional view showing a structure of an organic EL display element according to an embodiment of the present invention.
Figure 2:
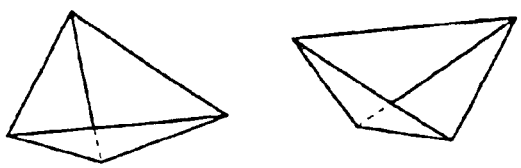
FIG. 2(a) is an explanatory drawing showing a unit structure of a corner cube array as a retro-reflector in the organic EL display element shown in FIG. 1.
FIG. 2(b) is a strabismus view showing a structure of the corner cube array.
FIG. 2(c) is a plan view showing a structure of the corner cube array.
FIG. 2(d) is an explanatory drawing showing reflecting directions of the light which is incident on the corner cube array.
Figure 2:
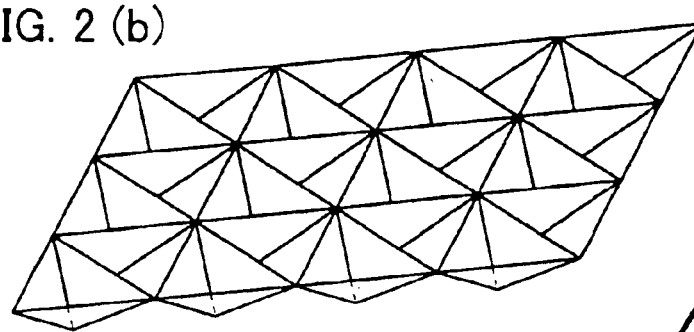
Figure 2:
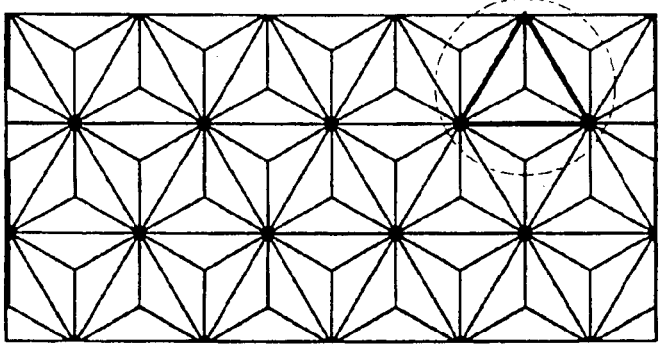
Figure 2:
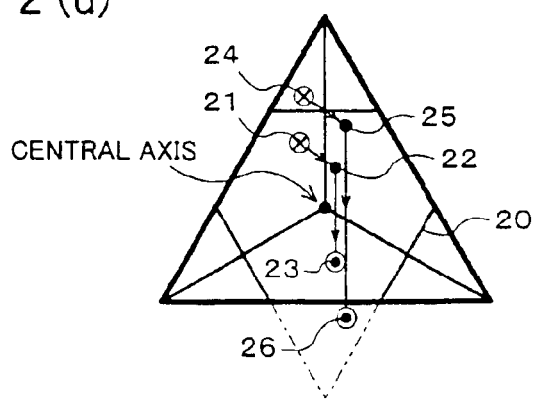

FIG. 1 is a cross sectional view showing an example of a structure of an organic electroluminescence display element (hereinbelow referred to as organic EL display element), which is a luminous display element. The organic EL display element according to the present embodiment, as shown in FIG. 1, includes an organic electroluminescence layer (hereinbelow referred to as organic EL layer (emission layer)) 1, a transparent electrode 2, an alminium electrode 3, a front side substrate 4, a retro-reflector (optical member, reflecting member) 5, a back side substrate 6, and a flattening film 7.

The transparent electrode 2, the organic EL layer 1, and the alminium electrode 3 are formed on the front side substrate 4 which is made of materials such as a transparent glass plate and a polymeric film, toward the back side of the organic EL display element in this order. The retro-reflector 5 and the flattening film 7 are formed on the back side substrate 6, toward the front side of the organic EL display element in this order. Further, the front side substrate 4 and the back side substrate 6 are provided with them facing each other.

The organic EL layer 1 which is an electroluminescence layer is made of an organic material, and includes an emission layer which emits the light. A state of the organic EL layer 1 changes between an emission state and a non-emission state. In the emission state, the emitted light emerges via the transparent electrode 2.

The transparent electrode 2 is made of an ITO (Indium Tin Oxide). Further, the transparent electrode 2 is connected to a power supply, and functions as a cathode. Note that, the transparent electrode 2 may be made of an IZO (Indium Zinc Oxide) and an Alminium Zinc Oxide etc.

The alminium electrode 3 is made of aluminum, and is formed with its thickness being 30 nm. Its thinness enables the light which is incident on the alminium electrode 3 to pass through the alminium electrode 3. Note that, when its thinness allows resistance of the alminium electrode 3 to become high, a transparent electrode made of an ITO film may be provided on the alminium electrode 3 so that the resistance of the alminium electrode 3 becomes low. Further, the alminium electrode 3 is connected to a power supply and functions as an anode.

The retro-reflector 5 is an optical member, and includes a corner cube array. In the corner cube array, the incident light is reflected in the same direction in which the light is incident. Thus, the corner cube array has retro-reflectivity. Further, the retro-reflector 5 is covered with the flattening film 7. By this, a surface of a layer on which the retro-reflector 5 is formed is flattened, and the alminium electrode 3 can be provided on an upper surface of the retro-reflector 5.

The organic EL layer 1 is described as follows.

The organic EL layer 1 is made of a single or a plurality of thin film including at least an emission layer. For example, the organic EL layer 1 is made up of an electron transport layer, the emission layer, and a hole transport layer. When a d.c. voltage is applied to the organic EL layer 1 with the transparent electrode 2 being a cathode and the alminium electrode 3 being an anode, the hole is injected from the anode and the electron is injected from the cathode to combine the hole and the electron again, so that the emission layer emits the light. When a voltage is applied, the emission layer emits light to become the emission state, so that the organic EL display element becomes the white state. Further, when a voltage is not applied, the emission layer is in the non-emission state, the organic EL display element becomes the black state.

A material for the emission layer of the organic EL layer 1 is not particularly restricted, as long as the material is an organic compound which can be used as an emitting material. The organic compound, for example, includes a fluorescent brightener such as benzothiazoles; benzoimidazoles; and benzooxazoles; and a metal chelating oxinoid compound, and a compound of styril benzenes.

A binding agent such as resin and an organic compound which is an emitting material are dissolved in a solvent to make a solution of them. Thereafter, the emission layer is formed in a form of a thin film by spin-coating. Although a thickness of the emission layer is not particularly restricted, it is preferable that the thickness is in a range from 5 nm to 5 µm. Further, the technique for forming a film of the emission layer is not particularly restricted to the spin-coating. The film may be formed by other techniques, for example, vacuum evaporation, casting, LB (Langmuir-Blodgett), and printing.

Further, it is preferable that the emission layer is made of a molecule vacuum evaporation film. The molecule vacuum evaporation film is a film which is formed by vacuum evaporation of a compound in a gaseous state or a film which is formed by solidifying a compound in a solution state or in a liquid state. This molecule vacuum evaporation film differs from a molecule built-up film which is a thin film made by the LB technique in an aggregation structure and in a high order structure, and the differences in the structures bring about differences in functions.

Note that, although it is more preferable that the electroluminescence layer is the organic EL layer, for example, it may be an inorganic electroluminescence layer which is formed by forming an amorphous SiNx in a form of a film.

The corner cube array is described as follows based on FIG. 2(a) to FIG. 4(d), FIG. 10, and FIG. 11.

The light which is incident on the corner cube array which is the retro-reflector 5 is retro-reflected on a surface of the corner cube array, that is, it is reflected in the same direction as an incident direction.

FIG. 2(a) to FIG. 2(d) show structures of the corner cube array. The corner cube array, as shown in FIG. 2(a) has a unit structure in a form of a triangular pyramid which is made of rectangular equilateral triangles. Further, FIG. 2(b) is a strabismus view showing a structure of the corner cube array, and FIG. 2(c) is a plan view showing a structure of the corner cube array. As shown in FIG. 2(c), the corner cube array includes a retro-reflecting section having retro-reflectivity and a non-retro-reflecting section having non-retro-reflectivity.

Seen from above, the unit structure of the corner cube array is an equilateral triangle as shown in FIG. 2(d). Seen from above, a hexagonal section 20 is a regular hexagon which touches the equilateral triangle, the unit structure, internally. The light which emerges from the front side and is incident on an incident point 21 in the hexagonal section 20 is reflected by a reflecting point 22 and emerges from a symmetrical point 23 to outside. In this way, the light which is incident on the incident point 21 in the hexagonal section 20 directs to the symmetrical point 23 so that the incident point 21 and the symmetrical point 23 are symmetrical with respect to a center axis by being reflected by the corner cube array. Here, the symmetrical position certainly exists in the same unit structure of the incident point 21.

In this way, the light which is incident on an incident point 21 in the hexagonal section 20 directs to a symmetrical position with respect to the central axis by reflecting in three faces which make up the unit structure of the corner cube array, and emerges in a backward direction with respect to the incident direction (retro-reflection).

However, the light which is incident on an incident point 24 which exists outside of the hexagonal section 20 is reflected in a reflecting point 25. A symmetrical point 26 and the incident point 24 are symmetrical with respect to the central axis, and the symmetrical point 26 does not exist in the same unit structure of the incident point 24. Thus, the light which is incident on the incident point 24 which exists outside of the hexagonal section 20 is not retro-reflected, and emerges from the corner cube array. Note that, an area of the regular hexagon which touches the equilateral triangle internally is two-thirds of an area of the equilateral triangle.

In this way, when the corner cube array is seen from above, an inside portion of the hexagonal section 20 is a retro-reflecting section. Further., an outside portion of the hexagonal section 20, that is, a periphery of a basic angle of the rectangular equilateral triangle which makes up the corner cube array is non-retro-reflecting section.

Thus, a light shielding process is performed on the non-retro-reflecting section, for example, by providing a light shielding film so that the light is absorbed without being reflected.

As described above, two-thirds of the light which is incident on the corner cube array emerges to outside by being retro-reflected in the retro-reflecting section. One-third of the light is absorbed in the non-retro-reflecting section, so that the light does not emerge to outside.

Thus, it is possible to prevent an image of the ambient light from being reflected. In this way, it is possible to realize good quality in the black state.

Figure 10:
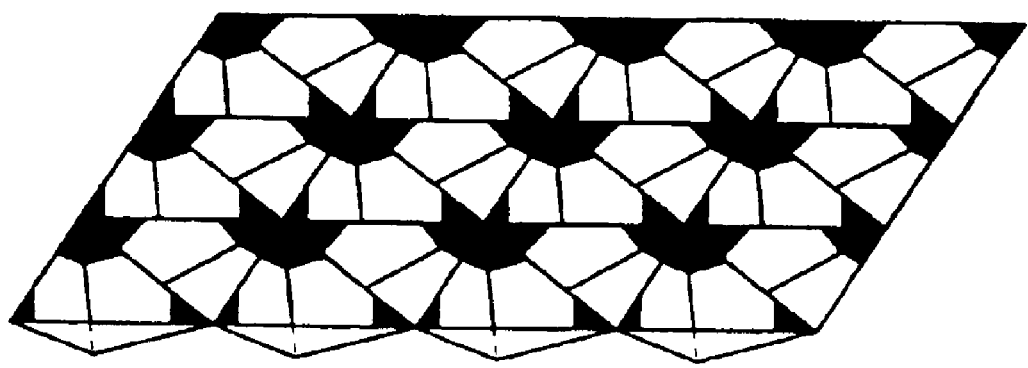
FIG. 10 is a strabismus view showing a structure of a corner cube array on which a light shielding process is performed.

Note that, the light shielding process may be performed, as shown in FIG. 10, not only on the non-retro-reflecting section but on apices or edges.

Thus, it is possible to absorb components which are incident on the edges and are reflected irregularly, and it is possible to further improve a quality in the black state. Therefore, it is possible to provide the organic EL display element which has higher contrast ratio.

The following is a description of an example of a manufacturing method of the corner cube array described above.

First, plural V grooves which are parallel with each other are formed with a V cutter on a mold member. Thereafter, the mold member is polished. Next, after the mold member is turned 60°, the same operation is performed. Further, after the mold member is turned 60° again, the same operation is performed. In this way, a male mold which includes plural triangular pyramids with them continuously side by side is manufactured. Thereafter, injection molding etc. are performed by using the male mold, so that a mold (female mold) made of, for example, glass and plastic is made. Further, a material whose surface reflectance is high, for example, an alminium or a silver is deposited on the retro-reflecting section on a surface of the mold, and the light shielding process is performed on the non-retro-reflecting section. By this, it is possible to obtain the corner cube array.

Figure 11:
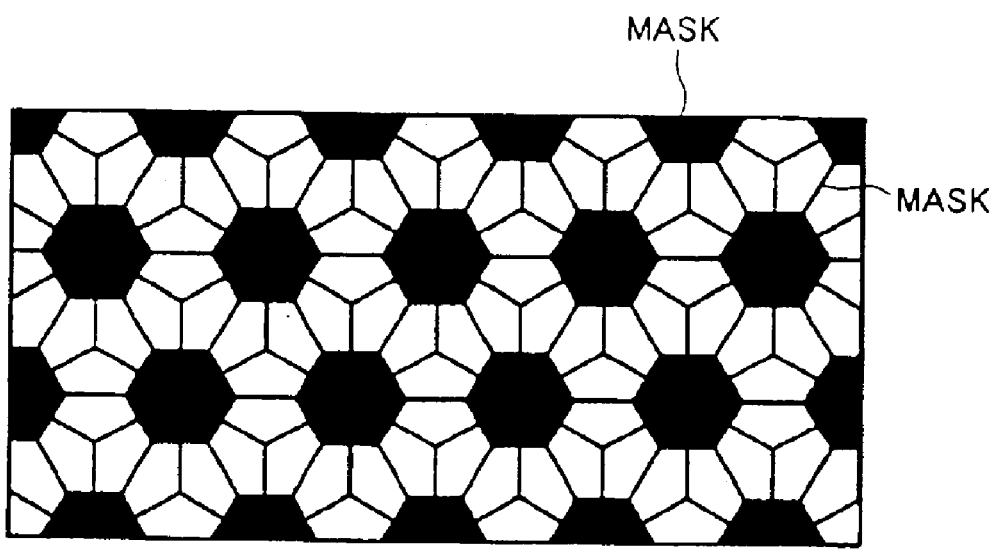
FIG. 11 is a plan view showing a part of a manufacturing process in which a mask is used to perform the light shielding process on the corner cube array.

As a technique for performing the light shielding process, for example, a positive-type black resist is provided on the corner cube array. Next, as shown in FIG. 11, a mask is formed on an area on which the light shielding process is to be performed, and is exposed. Then, a developing process is performed, so that it is possible to perform the light shielding process on the corner cube array.

Further, as another technique for performing the light shielding process is as follows. For example, a material, which changes from super water repellent to hydrophilic property when ultraviolet is irradiated on the material, is provided on the corner cube array. Next, as in the technique described above, as shown in FIG. 11, a mask is formed on an area on which the light shielding process is to be performed, and is exposed. It is possible to perform the light shielding process on the cube corner array by providing an hydrophobic, light absorbing member.

Figure 3:
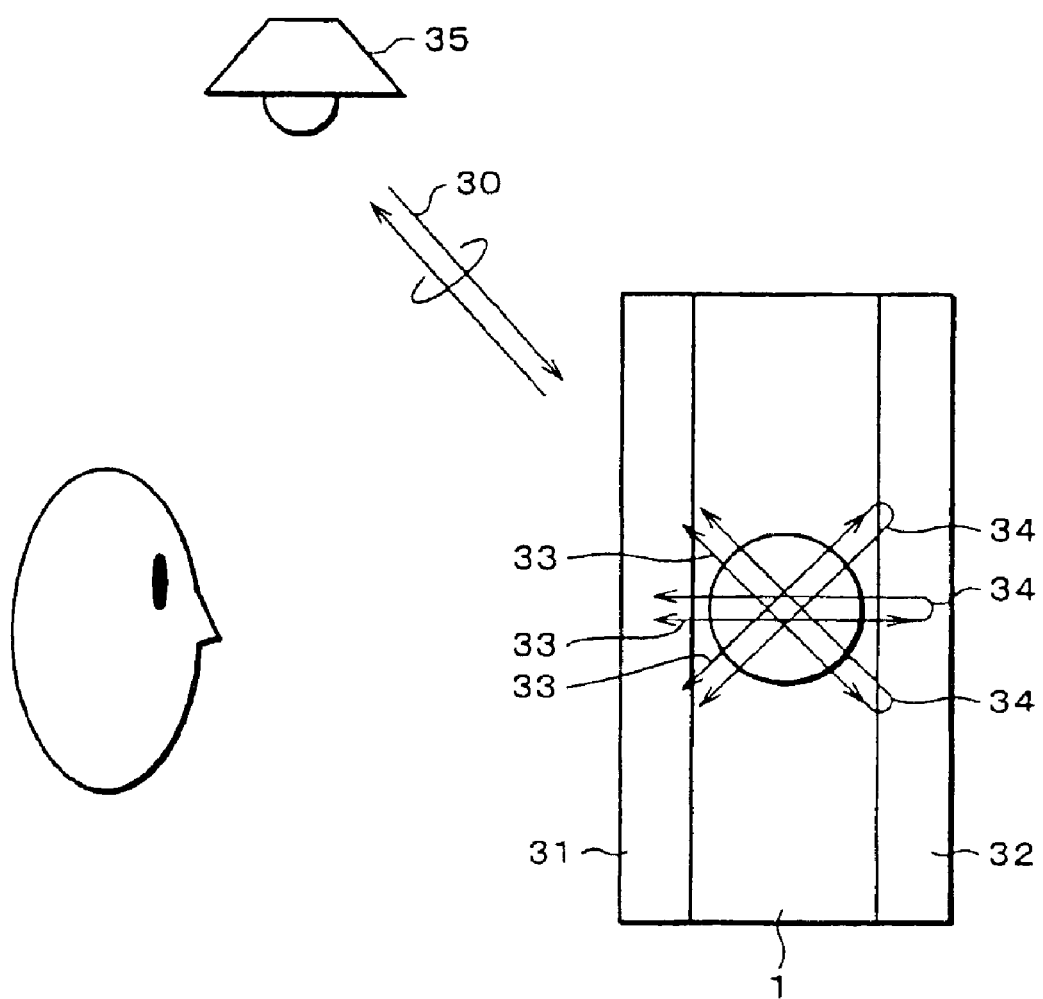
FIG. 3 is an explanatory drawing showing incident and outgoing directions of the ambient light and the light emitted in the organic EL layer.

FIG. 3 is an explanatory drawing showing incident/emerging directions of the ambient light and light emitted in the organic EL layer 1. A front surface section 31 and a back surface section 32 are provided with them facing each other via the organic EL layer 1. The front surface section 31 is made up of a front side substrate 4 and a transparent electrode 2. The back surface section 32 is made up of the alminium electrode 3, the corner cube array which is the retro-reflector 5, the flattening film 7, and the back side substrate 6.

For example, the ambient light 30 which emitted from the light source 35 passes through the front surface section 31 and the organic EL layer 1. Thereafter, the ambient light 30 is retro-reflected by the retro-reflecting section of the corner cube array in a direction of the light source 35, so that the reflected light does not emerges toward an observer. Further, even when the ambient light 30 is incident on the non-retro-reflecting section of the corner cube array, the reflected light does not emerge toward an observer because the light shielding process is performed on the non-retro-reflecting section. Thus, an image of the ambient light 30 is not reflected in the organic EL display element when a voltage is not applied to the organic EL layer 1, so that it is possible to realize high-quality in the black state.

Further, when a voltage is applied, the emission layer in the organic EL layer 1 emits the light in directions of the front side and the back side of the organic EL display element. The light 33 which is emitted to the front side of the organic EL display element emerges directly to outside of the organic EL display element. The light 34 which is emitted to the back side of the organic EL display element is retro-reflected by the corner cube array, so that the light 34 is reflected in a direction in which it is incident on the corner cube array and emerges to outside of the organic EL display element. Further, as in a time when a voltage is not applied, the ambient light 30 is also retro-reflected by the corner cube array and emerges.

Thus, the corner cube array is provided on the back side of the organic EL layer 1, so that the lights 33 and 34 which are emitted in the organic EL layer 1 can emerge to the front side of the organic EL display element. Therefore, it is possible to realize high lightness and good quality in the white state. Further, since not only the light 33 emitted to the front side but also the light 34 emitted to the back side to emerge can emerge, it is possible to improve the utilization efficiency of emission.

Note that, as long as the incident light is retro-reflected, the retro-reflector 5 is not restricted to the corner cube array. Thus, as shown in FIG. 4(a), a corner cube array whose unit structure is made up of three squares may be used. FIG. 4(b) is a strabismus view showing a structure of the corner cube array, and FIG. 4(c) is a plan view showing a structure of the corner cube array.

When the corner cube array shown in FIG. 4(b) is seen from above, a shape of the unit structure is a regular hexagon. As shown in FIG. 4(d), for example, the light which is incident on an incident point 41 is reflected by a reflecting point 42, and the incident point 41 and a symmetrical point 43 are symmetrical with respect to the central axis, and the light emerges from the symmetrical point 43. Thus, the unit structure of the corner cube array is a regular hexagon when the corner cube array shown in FIG. 4(b) is seen from above, so that a symmetrical position which is symmetrical with respect to an incident point 41 on the corner cube array certainly exists in the same unit structure of the incident point 41. Therefore, it is possible to retro-reflect all the light which is incident on the corner cube array.

The corner cube array like this can be made by using a single crystal substrate such as a compound semiconductor having a zinc blend structure and a substrate made of a material having a diamond structure which is made of a crystal of cubic system. A concrete manufacturing method is described as follows.

First, it is required to prepare a cubic single crystal substrate (for example, a gallium arsenide single crystal substrate) whose surface is provided substantially parallel with a {1 1 1} side whose surface is a crystal. Then, an anisotropic etching process is performed on a surface of the cubic single crystal substrate. In this way, irregularities are formed on the surface of the substrate.

Thereafter, on the substrate on which the irregularities are formed, a thin film made of a reflecting material, for example, alminium or silver is formed at a substantially uniform thickness so that the thin film is provided along the irregularities by, for example, vacuum evaporation. In this way, it is possible to obtain the corner cube array shown in FIG. 4(b).

Note that, the compound semiconductor having a zinc blend structure includes InP, InAs, ZnS, and GaP.

Or, it is also possible that an electroforming mold is made by using the substrate on which the irregularities are formed, and the irregularities are transcribed on a resin material to make the corner cube array by using the electroforming mold. Also in this case, a thin film made of a reflecting material is formed by vacuum evaporation etc., so that it is possible to give the surface reflectivity.

Further, the retro-reflector 5 may be arranged by using a micro sphere such as a microbeads array and a microlens array, instead of the corner cube array.

Figure 4:
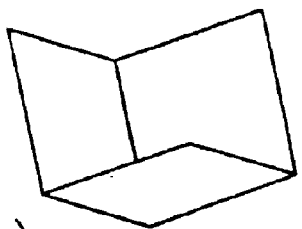
FIG. 4(a) is an explanatory drawing showing another unit structure of the corner cube array.
FIG. 4(b) is a strabismus view showing a structure of the corner cube array.
FIG. 4(c) is a plan view showing a structure of the corner cube array.
FIG. 4(d) is an explanatory drawing showing reflecting directions of the light which is incident on the corner cube array.
Figure 4:
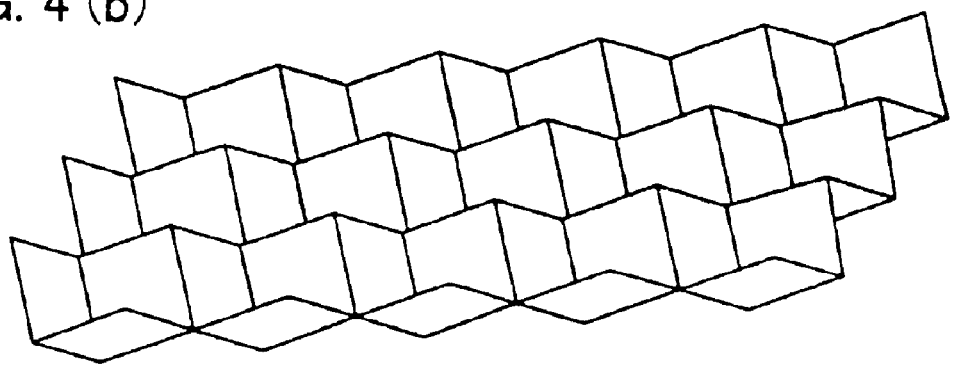
Figure 4:
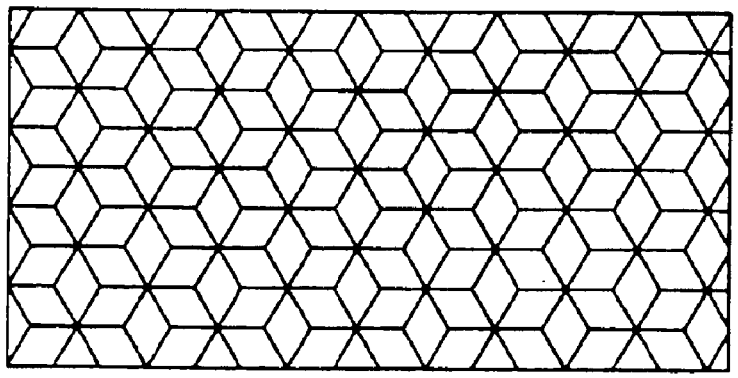
Figure 4:
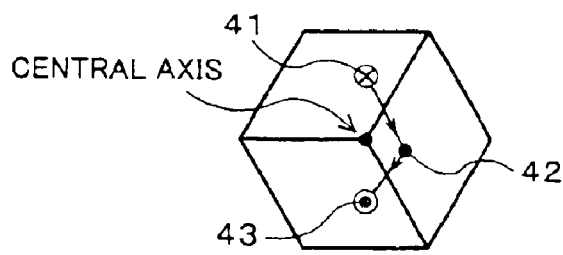
Figure 12:
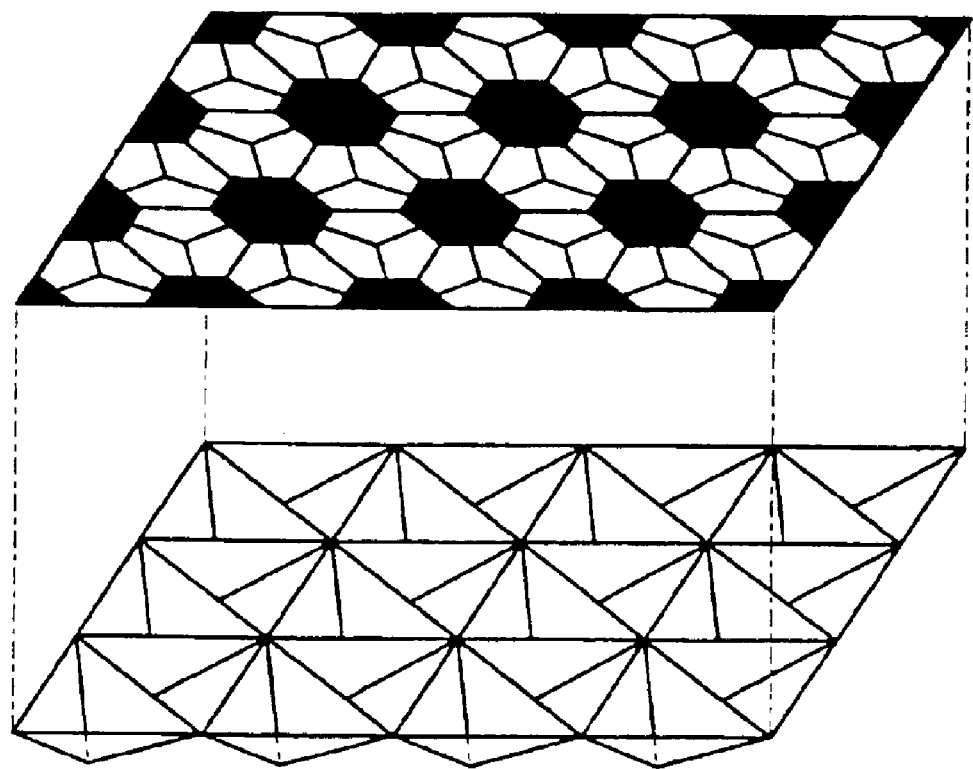
FIG. 12 is a strabismus view showing a structure of a light shielding section provided in a position away from the corner cube array.
Figure 13:
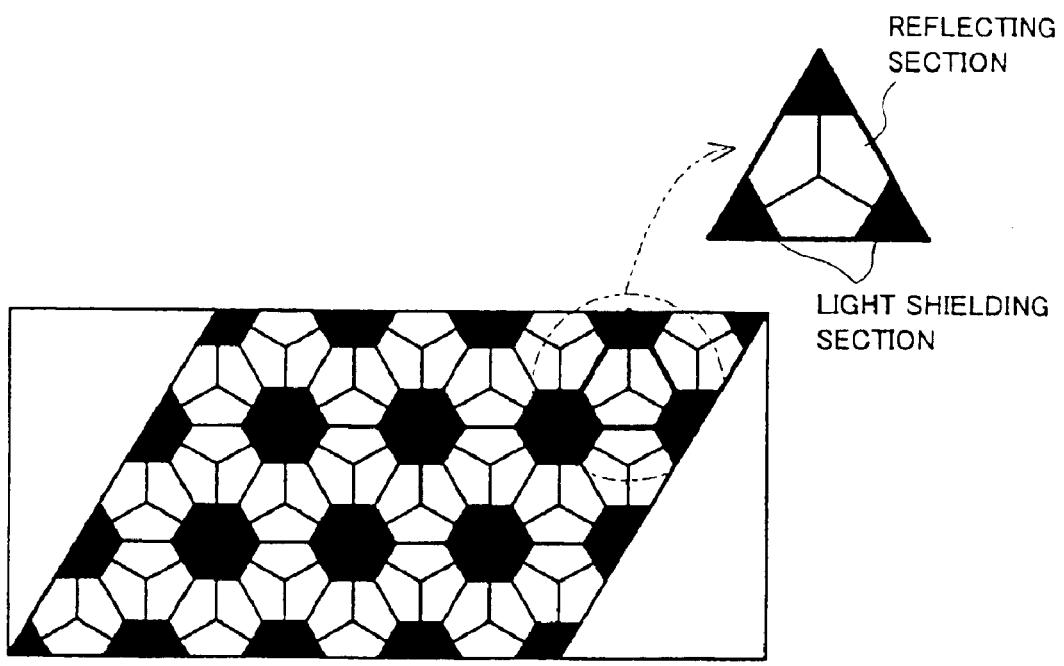
FIG. 13 is a plan view showing a structure of the light shielding section and the corner cube array.
Figure 14:
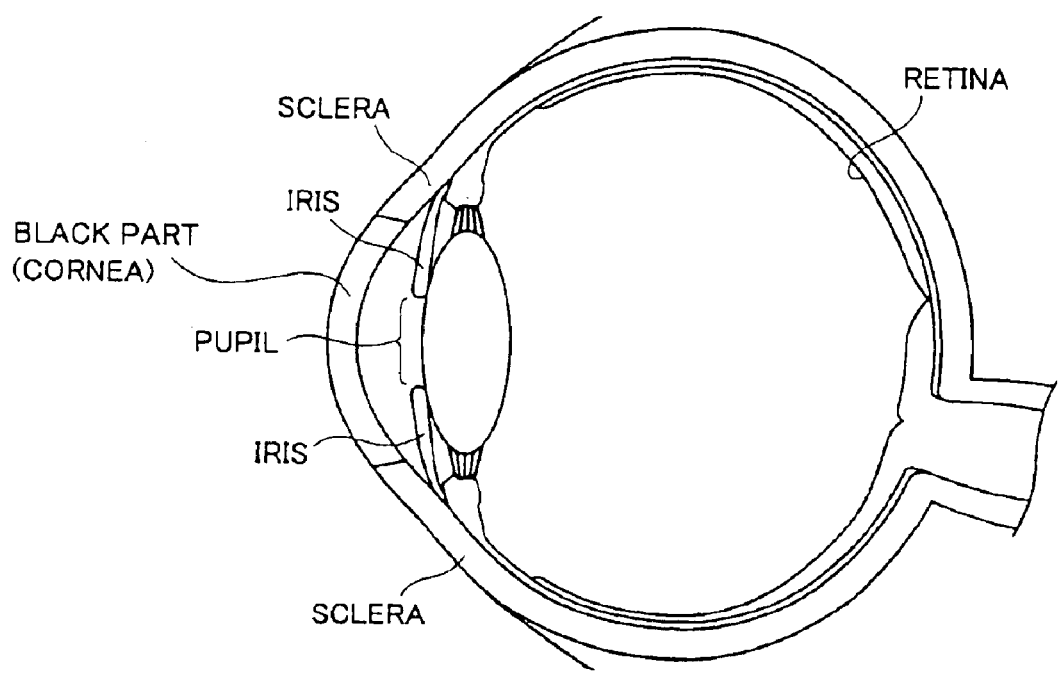
FIG. 14 is an explanatory drawing showing a structure of an eye.
Figure 15:
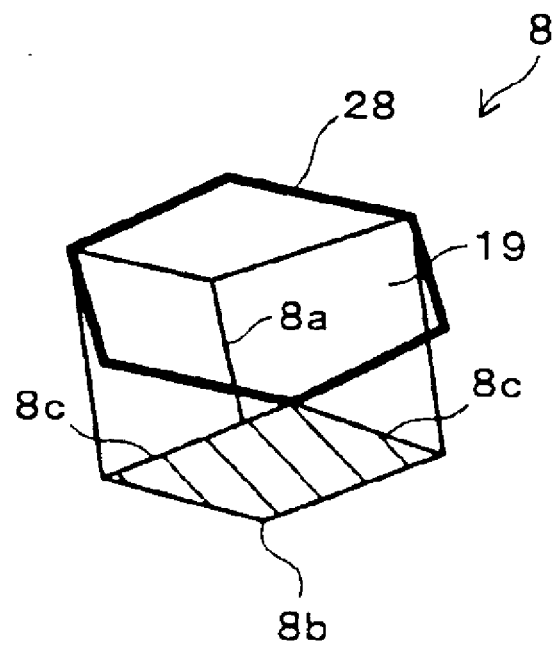
FIG. 15(a) is a strabismus view showing a structure of a light shielding section which covers only the periphery of the corner cube array.
FIG. 15(b) is a strabismus view showing a structure of a light shielding section which covers only the periphery of the corner cube array.
Figure 15:
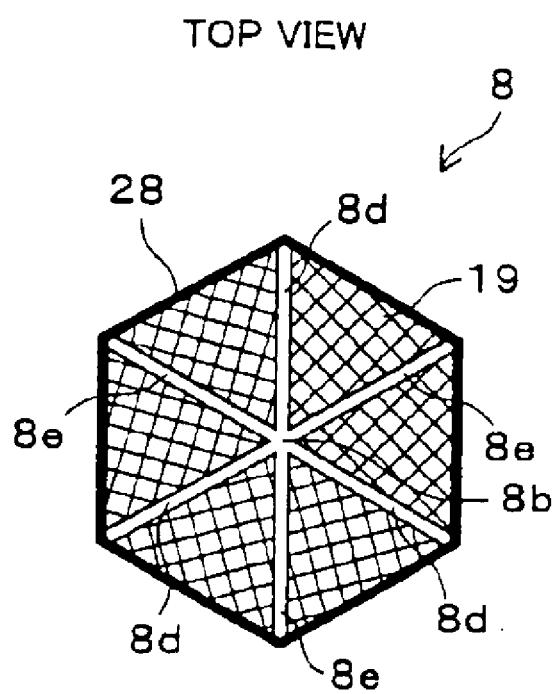
Figure 18:
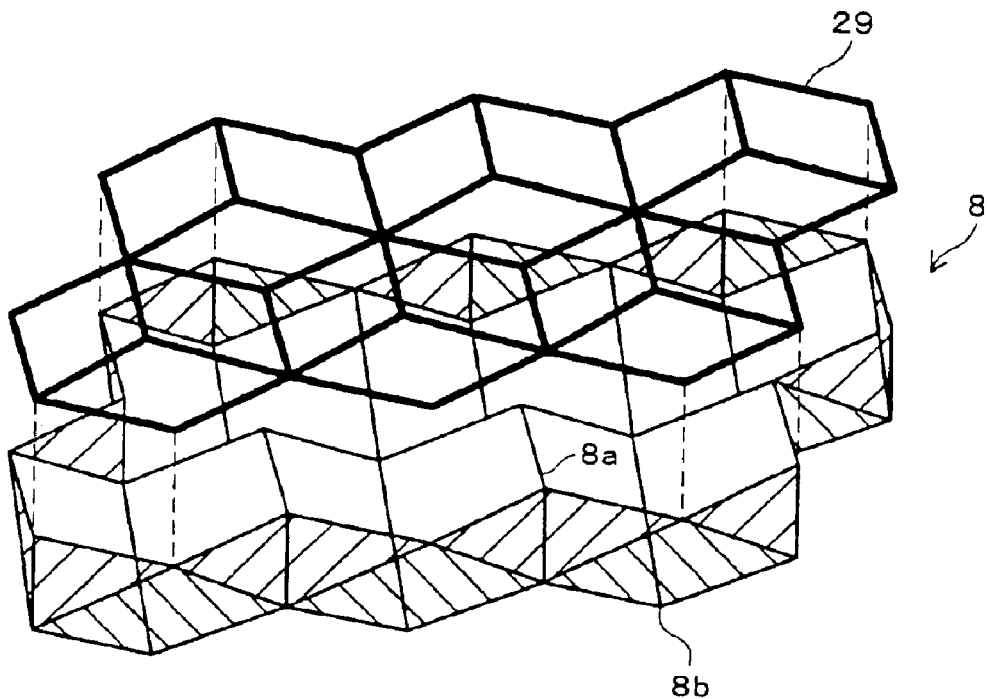
FIG. 18(a) is a strabismus view showing a structure of a light shielding section which covers edges and apices of a corner cube array.
FIG. 18(b) is a plan view showing a structure of a light shielding section which covers edges and apices of a corner cube array.
Figure 18:
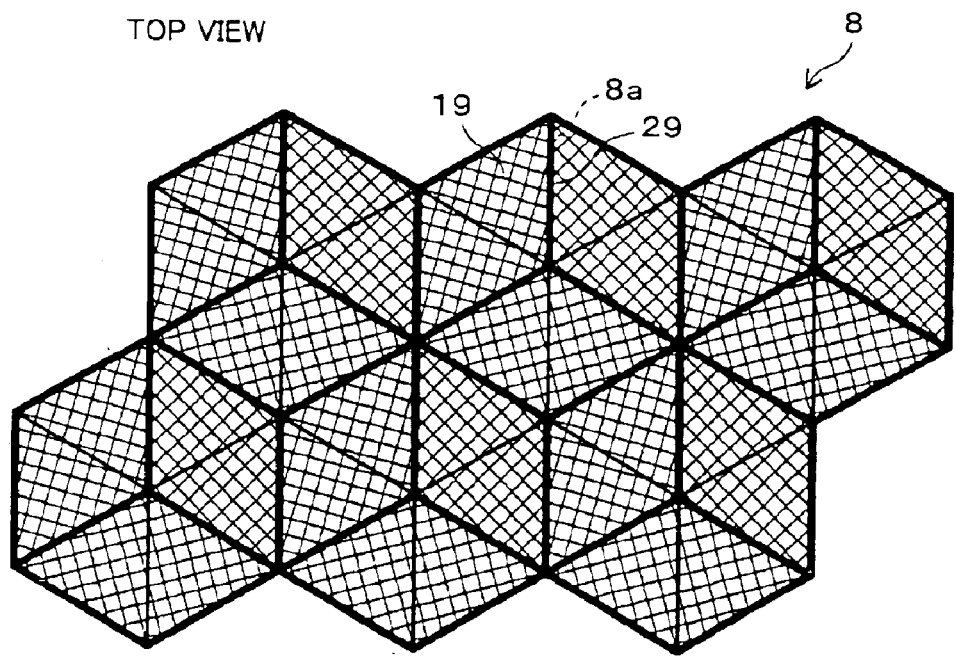

Here, the following is a description based on FIG. 12, FIG. 13, FIG. 15(*a*) to FIG. 18(*b*), which shows an example in which the light shielding process is not performed on a surface of the corner cube array, but a light shielding section is provided as an independent member from the corner cube array in the unit structure (corner cube) of the corner cube array shown in FIG. 4(*a*).

As shown in FIG. 15(*a*) and FIG. 15(*b*), when a corner cube 8 (unit structure of the retro-reflector 5) is seen from above, the light shielding section 28 is provided on the corner cube 8 so as to cover a peripheral side of the corner cube 8.

Here, as shown in FIG. 15(*b*), there was the following case. The irregularly reflected light 8*d* which was reflected by an apex 8*b* and edges 8*a* and 8*c*, and the reflected light 8*e* which was reflected by a reflecting surface 19 facing the irregularly reflected light 8*d* looked white, so that quality in the black state deteriorated.

Figure 16:
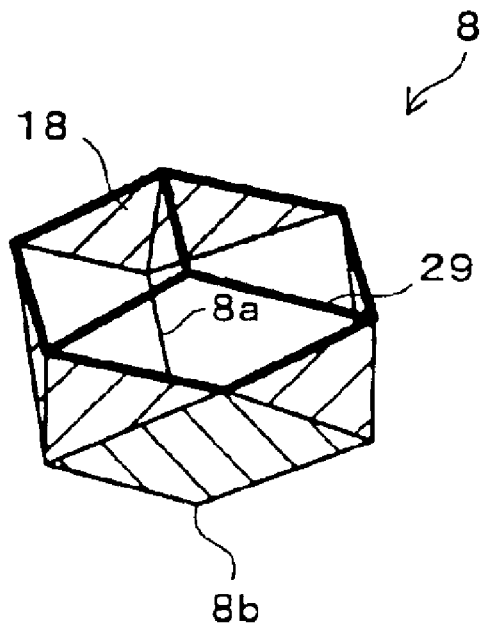
FIG. 16(a) is a strabismus view showing a structure of a light shielding section which covers edges and apices of a corner cube.
FIG. 16(b) is a plan view showing a structure of a light shielding section which covers edges and apices of a corner cube.
Figure 16:
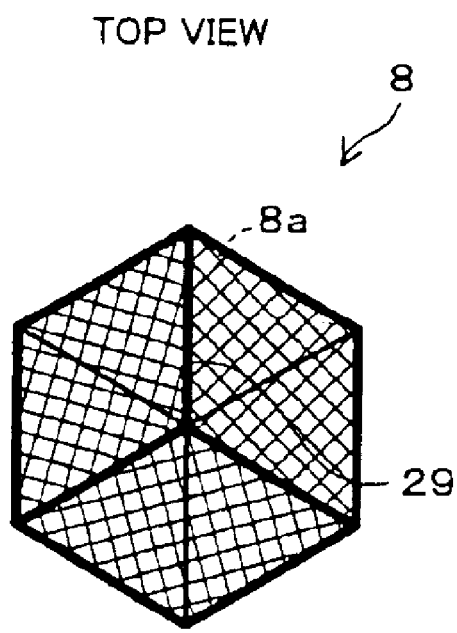

Thus, as shown in FIG. 16(*a*) and FIG. 16(*b*), the light shielding process is performed on the apex 8*b* and edges 8*a* and 8*c* of the corner cube 8 which is the unit structure of the retro-reflector 5 so that the light described above is not reflected, and a light shielding section 29 which shields the irregularly reflected light is provided above the corner cube 8. That is, the light shielding section 29 is means for absorbing and shielding the light reflected from the apex 8*b* and the edges 8*a* and 8*c*.

The light shielding section 29 is formed in a form of a strip so as to cover the apex 8*b* and the edges 8*a* and 8*c*, and, for example, it is preferable that the light shielding section 29 is made of the same material as a black matrix described later.

As shown in FIG. 16(*b*), by the light shielding section 29, it is possible to shield the irregularly reflected light 8*d* (see FIG. 15(*b*)) which is reflected from the apex 8*b* and the edges 8*a* and 8*c*, and it is possible to reduce the incident light which is incident on the apex 8*b* and the edge 8*a* and 8*c* and to suppress the reflected light, so that quality in the black state can be improved.

Further, as shown in FIG. 16(*a*), when the light shielding section 29 is provided above the corner cube 8, a light absorbing section 18 in a form of a plate may be provided in a gap between a surface of the corner cube and the peripheral sides of the light shielding section 29. Thus, the irregularly reflected light can be absorbed further, so that quality in the black state is improved further.

Further, the light shielding section 29, as shown in FIG. 18(*a*) and FIG. 18(*b*), may be provided, for example, on a color filter layer which is provided in a position away from the retro-reflector 5.

Figure 17:
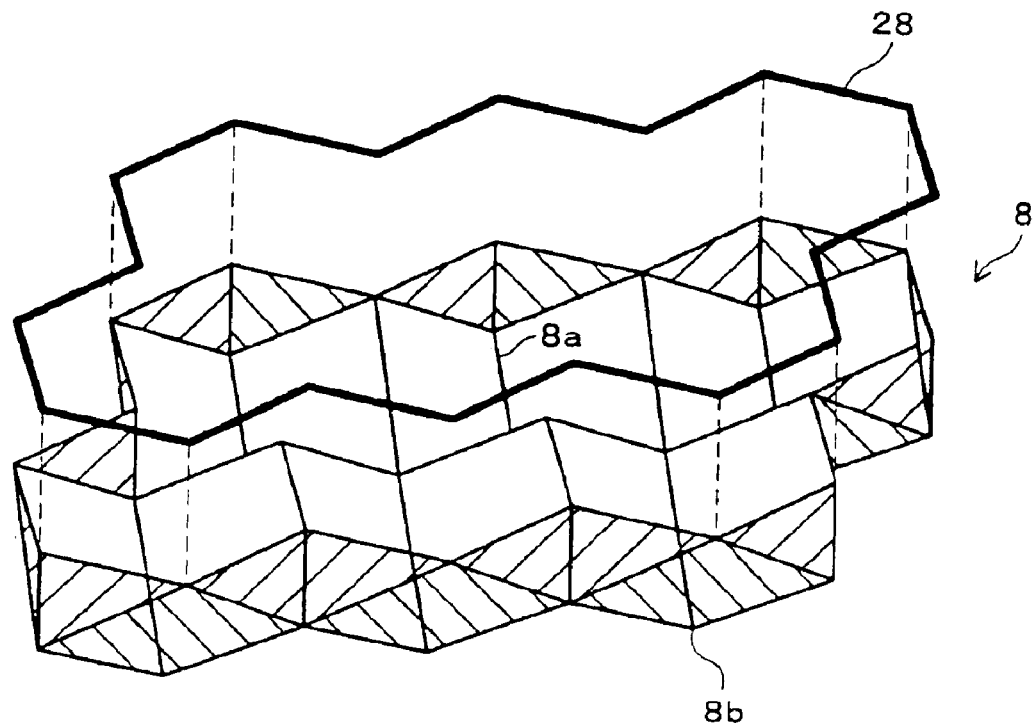
FIG. 17(a) is a strabismus view showing a structure of a light shielding section which covers only the periphery of a corner cube array.
FIG. 17(b) is a plan view showing a structure of a light shielding section which covers only the periphery of a corner cube array.
Figure 17:
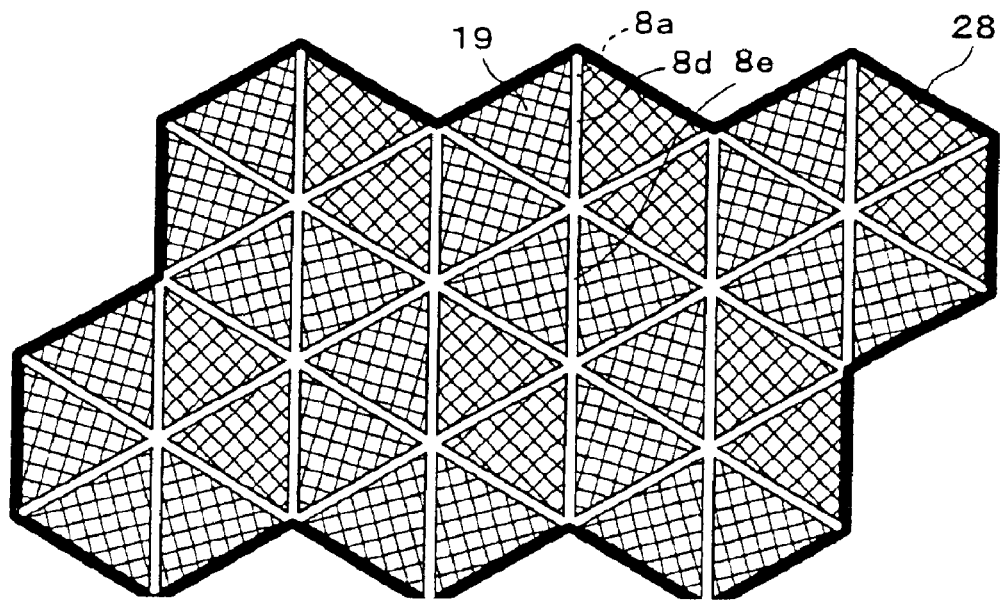

For example, as shown in FIG. 17(*a*) and FIG. 17(*b*), when the light shielding section 28 which covers only the peripheral sides of the corner cube 8 as in FIG. 15(*a*) and FIG. 15(*b*), the irregularly reflected light 8*d* which is reflected from edges of the apex 8*b* and the edges 8*a*, and the reflected light 8*e* which is reflected in the reflecting surface 19 facing the irregularly reflected light 8*d* look white, so that quality in the black state deteriorates.

However, as shown in FIG. 18(*a*) and FIG. 18(*b*), when the light shielding section 29 is provided in a position away from the retro-reflector 5, the light shielding section 29 improves quality in the black state as in the above.

Note that, when the light shielding section 29, for example, is provided on the color filter layer, it is preferable that the light shielding section 29 is made of the same material and at the same time as the black matrix.

Further, in FIG. 18(*a*), description is given by using the corner cube array whose unit structure is made up of three squares. As shown in FIG. 12, the light shielding section which covers an apex and edges of the corner cube array (which shields the apex and the edges) may be provided in a position away from the corner cube array whose unit structure is made up of rectangular equilateral triangles, for example, the light shielding section may be provided on the color filter layer.

When the corner cube array is seen from above (plan view of the corner cube array), it looks as in FIG. 13, both in the case where the light shielding process is performed on the surface of the corner cube array whose unit structure is made up of three squares (that is, the light shielding section is provided) and in the case where the light shielding section is provided in a position away from the corner cube array.

Figure 5:
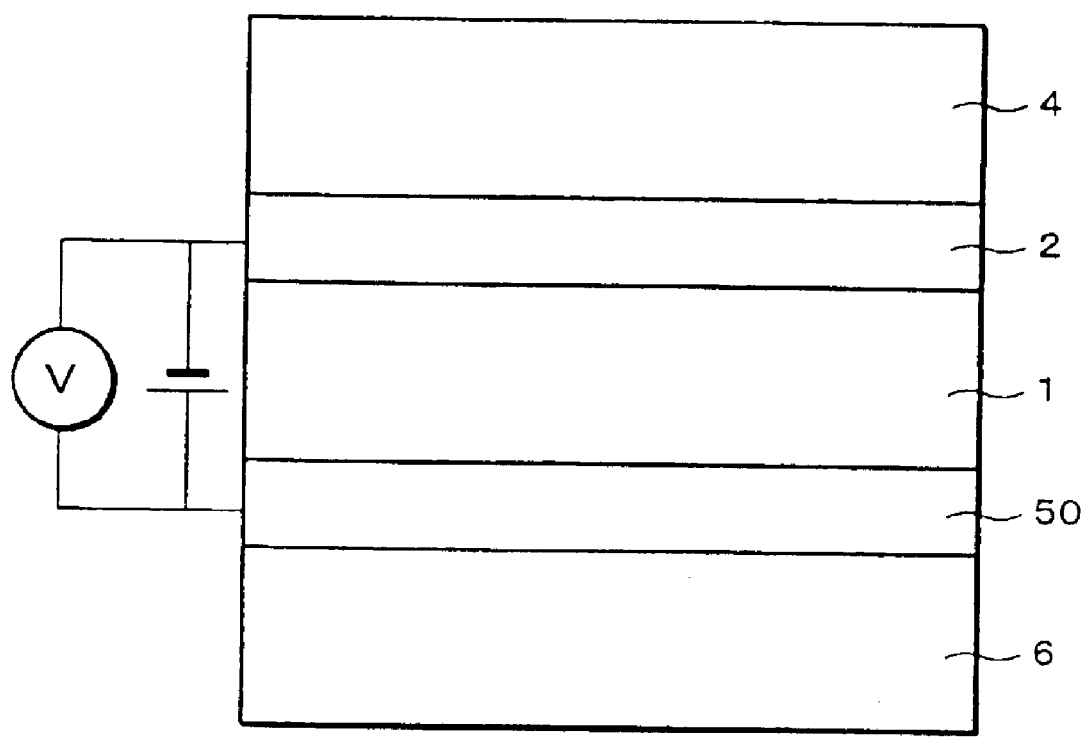
FIG. 5 is a cross sectional view showing a structure of the organic EL display element in a comparative example.

Here, based on FIG. 5, the organic EL display element which includes a metal electrode 50 instead of the alminium electrode 3, the flattening film 7, and the retro-reflector 5 is described as a comparative example.

As shown in FIG. 5, the metal electrode 50 in the comparative example is provided on the front side of the back side substrate 6, and is connected to the power supply as an anode. When a d.c voltage is applied with a transparent electrode 2 being a cathode and the metal electrode 50 being the anode, a hole is injected from the anode and an electron is injected from the cathode to an emission layer, and recombination of the hole and the electron allows the emission layer in the organic EL layer 1 to emit the light. Further, a surface of the metal electrode 50 is flat.

When a voltage is applied, the light emitted in the emission layer is reflected on a surface of the metal electrode 50, and emerges to outside of the organic EL display element. Here, the organic EL display element shows the white state in which high lightness and good quality are realized.

While, when a voltage is not applied, the ambient light which passed through the organic EL layer 1 is reflected by the metal electrode 50 and emerges to outside of the organic EL display element. Thus, an image is reflected in the organic EL display element, so that it is impossible to realize good quality in the black state.

Further, in order to realize good quality in the black state with the reflection of an image suppressed, the reflectance of the metal electrode 50 is lowered, or the polarizing film and the quarter wavelength retardation film are provided on the front side of the organic EL layer 1 in the organic EL display element, so that the reflected light of the ambient light is absorbed. As a result, the light emitted in the organic EL layer 1 is absorbed in the metal electrode 50 or the polarizing film. Thus, the utilization efficiency of emission degrades.

When the structure in which the flat metal electrode 50 is provided so as to reflect the ambient light like the foregoing comparative example, an image is reflected in the organic EL display element, so that it is impossible to realize good quality in the black state. Further, when contrast ratio is to be improved by realizing good quality in the black state, the utilization efficiency of emission degrades in the organic EL display element.

On the other hand, in the organic EL display element of the present embodiment, since the corner cube array is provided as the retro-reflector 5, it is possible to reflect the ambient light in the same direction as the direction in which the ambient light is incident. Thus, since the ambient light does not emerge toward an observer, an image is not reflected in the organic EL display element. Thus, it is possible to realize good quality in the black state. Further, since the corner cube array is provided on the back side of the organic EL layer 1, the utilization efficiency of emission is high. Further, it is possible to realize high lightness and high quality in the white state.

As described above, in the organic EL display element of the present embodiment, the corner cube array is provided on the back side of the organic EL layer 1, so that it is possible to realize good quality in the black state and to realize high lightness and good quality in the white state. Thus, it is possible to provide the organic EL display element whose contrast ratio is high.

Figure 6:
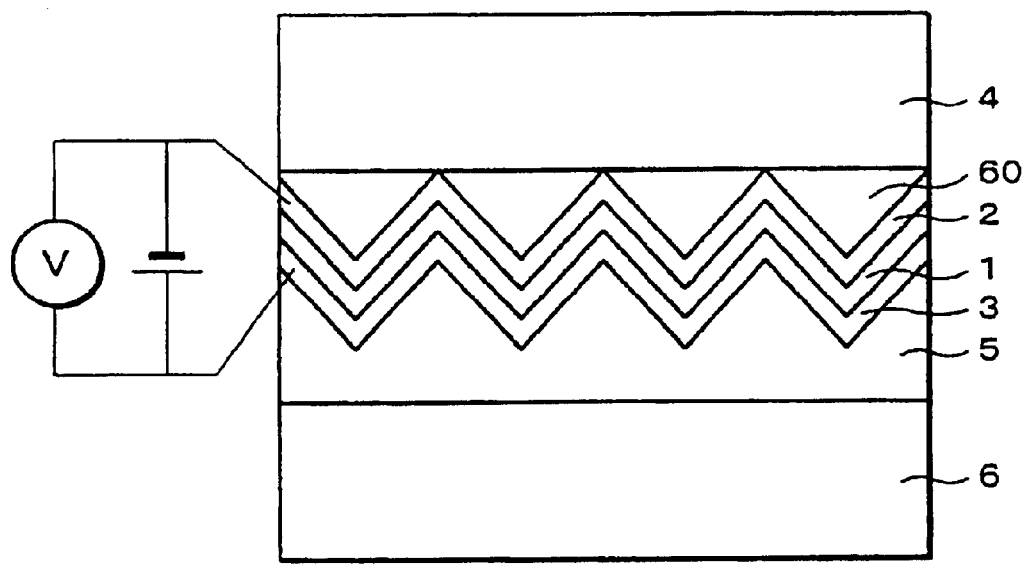
FIG. 6 is a cross sectional view showing a structure of the organic EL display element according to another embodiment of the present invention.

Note that, instead of providing the flattening film 7 on the retro-reflector 5, as shown in FIG. 6, the alminium electrode 3, the organic EL layer 1, and the transparent electrode 2 may be provided on the retro-reflector 5 in this order, and a flattening film 60 may be provided on the transparent electrode 2.

In this case, unlike the organic EL display element described above (FIG. 1), the alminium electrode 3 in the organic EL display element shown in FIG. 6 has the same form as the retro-reflector 5. Thus, it is possible for the alminium electrode 3 to retro-reflect the incident light. Therefore, it is not required to make the alminium electrode 3 so thin that the ambient light can pass through the alminium electrode 3. Thus, for example, it is possible to give a 300 nm thickness to the alminium electrode 3. In this way, it is not required to make the alminium electrode 3 thin, so that its resistance value does not become high.

Further, as shown in FIG. 6, in a case where the organic EL layer 1 and the retro-reflector 5 are combined with each other, a surface on which the ambient light is reflected is provided on the backside of the organic EL layer 1. Thus, it is possible to obtain the same effect as the organic EL display element described above (FIG. 1). That is, it is possible to improve the utilization efficiency of emission and to realize high quality in the black state.

A suitable range of the pitch of the unit structure in the retro-reflector 5 is described as follows based on FIG. 7(*a*) to FIG. 7(*c*).

Figure 7:
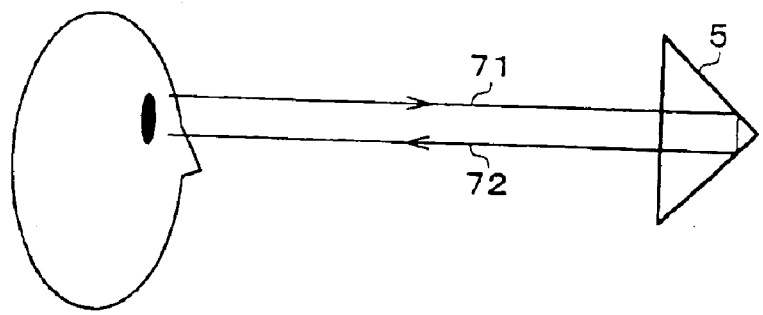
FIG. 7(a) is an explanatory drawing showing optical paths of the incident light and the reflected light in a case where an observer observes the periphery of a center of a unit structure of a retro-reflector.
FIG. 7(b) is an explanatory drawing showing optical paths of the incident light and the reflected light in a case where an observer observes the periphery of an upper end and a lower end of a unit structure of a retro-reflector which includes the corner cube array.
FIG. 7(c) is an explanatory drawing showing optical paths of the incident light and the reflected light in a case where the observer observes the periphery of an upper end and a lower end of a unit structure of a retro-reflector which is made of a micro sphere.
Figure 7:
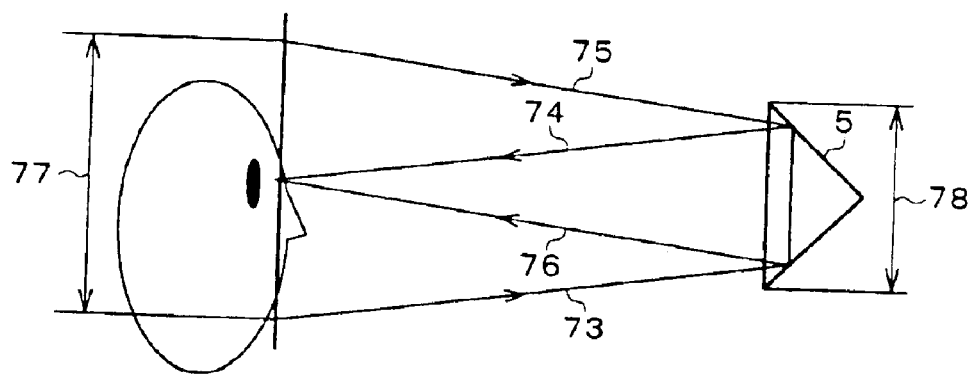
Figure 7:
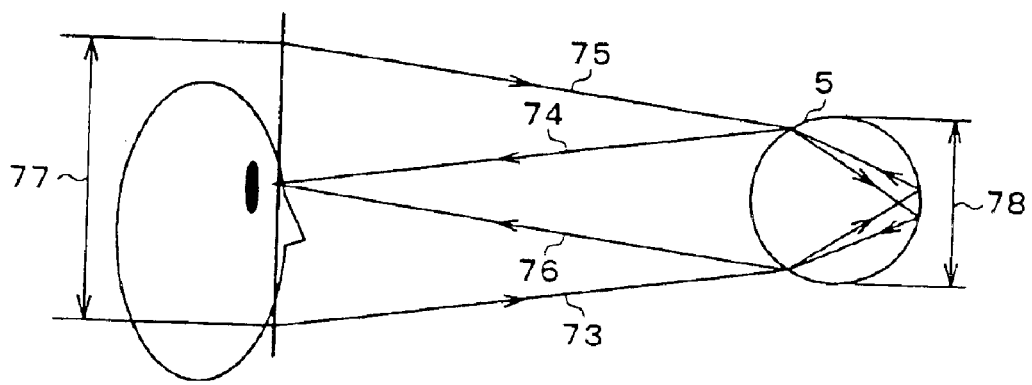

FIG. 7(*a*) to FIG. 7(*c*) are explanatory drawings showing an optical path of the incident light and the reflected light. FIG. 7(*a*) shows a case where an observer observes the vicinity of the center of the unit structure of the retro-reflector 5. FIG. 7(*b*) shows a case where an observer observes an upper end and a lower end of the unit structure of the retro-reflector 5 made of the corner cube array. FIG. 7(*c*) shows a case where an observer observes the vicinity of an upper end and a lower end of the unit structure of the retro-reflector 5 made of a micro sphere.

In the respective retro-reflectors 5 which were made of the corner cube array, the micro sphere (beads) array, and the microlens array, the pitches of the unit structures were set to four kinds of 0.5 mm, 5 mm, 10 mm, and 25 mm, so that, in total, 12 kinds of organic EL display elements were manufactured.

Here, the pitch of the unit structure, for example, is the shortest distance between the corresponding positions of the adjacent corner cubes (for example, the shortest distance between an apex of a corner cube and an apex of another corner cube) in a case of the corner cube array, and is the shortest distance between the corresponding positions of the adjacent micro spheres (for example, the shortest distance between a center of a micro sphere and a center of another micro sphere) in a case of the micro sphere array.

As a result, in organic EL display elements whose retro-reflectors 5 were made of any of the corner cube array, the micro sphere array, and the microlens array, it was the organic EL display element in which the pitch of the unit structure of the retro-reflector 5 was 0.5 mm or 5 mm that realized good quality in the black state. In the organic EL display element in which the pitch of the unit structure of the retro-reflector 5 is 10 mm or 25 mm, regardless of its form, an eyelid or an eyebrow was reflected on the surface of the retro-reflector 5, and the surface is blurred with luminance of the eyelid or the eyebrow, so that it was impossible to realize good quality in the black state.

That is, as shown in FIG. 7(*a*), when an observer observes the periphery of the center of the unit structure of the retro-reflector 5, a position of the light source of the observed light is in the vicinity of eyes of the observer. That is, in this case, the incident light 71 which emerges from the vicinity of the observer's eye and is incident on the organic EL display element is retro-reflected by the retro-reflector 5, and the observer observes the reflected light 72.

While, as shown in FIG. 7(*b*) and FIG. 7(*c*), when an observer observes the periphery of an upper end of the unit structure of the retro-reflector 5, a position of the light source of the observed light is below the eyes of the observer. That is, in this case, incident light 73 which emerges from the down side of the eyes of the observer and is incident on the organic EL display element is retro-reflected by the retro-reflector 5, and the observer observes the reflected light 74. Here, when the pitch of the unit structure of the retro-reflector 5 is wide, a lower eyelid and a cheek are reflected according to the width. Thus, the observer observes the lower eyelid and the cheek.

Further, when an observer observes the periphery of a lower end of the unit structure of the retro-reflector 5, a position of the light source of the observed light is upper side of the observer's eyes. That is, in this case, the incident light 75 which emerges from the upper side of the eyes of the observer and is incident on the organic EL display element is retro-reflected by the retro-reflector 5, and the observer observes the reflected light 76. Here, when the pitch of the unit structure of the retro-reflector 5 is wide, the upper eyelid and the eyebrow are reflected according to the width. Thus, the observer observes the upper eyelid and the eyebrow.

These descriptions show that an image which is reflected in the unit structure of the retro-reflector 5 is an image of an area 77 which is twice as long as a pitch 78 in the unit structure of the retro-reflector 5. That is, in order to realize good quality in the black state, it is required to make the area 77 which is twice as long as the pitch 78 in the unit structure of the retro-reflector 5 smaller than the size of a black part of an observer's eye. When the size of the black part (diameter) is about 10 mm, it is required to make the pitch 78 of the unit structure of the retro-reflector 5 not more than 5 mm.

Further, the black part (cornea) is described more specifically. According to FIG. 14, a pupil and an iris exist within a black part. Different races have different colors of irises (reflected light). The color of iris of Asian is dark, and the iris of Westerner is colored. Since the pupil is transparent, the color of the pupil (reflected light) bears the color of internal organs such as a retina. However, it may not be incorrect to think that the pupil bears black. That is, the pupil has a function as a diaphragm for shielding unnecessary light. Thus, as long as an observer observes a display (as long as the observer does not observe the light source), reflection of internal organs such as a retina is small. As a result, it may not be incorrect to think that the pupil bears black.

From the foregoing view point, a study on the foregoing subject including the color of a retina was performed as in the foregoing description, and as a result of the study, it turned out to be more preferable that the pitch of the unit structure of the retro-reflector 5 is not more than half of about 2 mm which is the size of the pupil (diameter) (*Questions and Answers, Encyclopedia of Eye*, Volume 1, Yasumasa Okuzawa, published by Higashiyama shobo), that is, not more than 1 mm.

Thus, it is more preferable that the pitch of the unit structure (corner cube) of the retro-reflector 5 is not more than 1 mm.

By this, in the black state, it is possible to narrow an image which is observed by an observer from the black part to the pupil, and it is possible to improve quality in the black state.

Further, when the organic EL layer 1 includes three color-areas of red (R), green (G), and blue (B), it is possible for the organic EL display element to realize a full-color display. The following is a description of an optical path in which the light passes through the organic EL layer 1 showing respective colors in a case where the size of the unit structure of the retro-reflector 5 in the organic EL display element shown in FIG. 1 is larger than the size of dots showing respective colors of red (R), green (G), and blue (B), and in a case where the size of the unit structure is smaller than the size of the dots. This is described based on FIG. 8(*a*) and FIG. 8(*b*), and FIG. 9(*a*) and FIG. 9(*b*).

Figure 8:
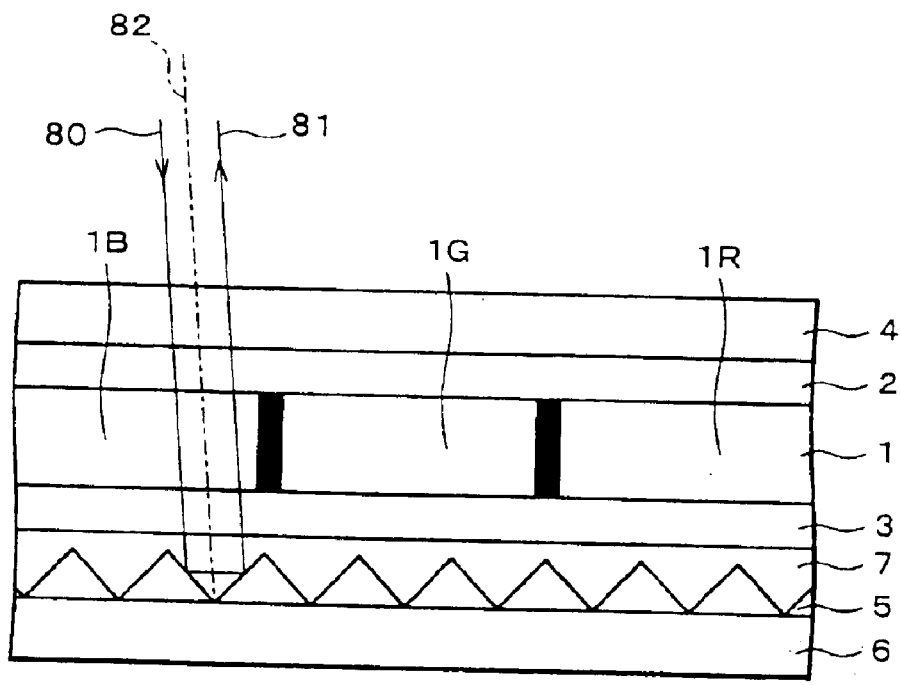
FIG. 8(a) is a cross sectional view showing a structure of the organic EL display element in a case where the corner cube array is used as a retro-reflector when the size of the unit structure of the corner cube array is not more than a dot size of respective colors in the organic EL display element shown in FIG. 1.
FIG. 8(b) is a cross sectional view showing a structure of the organic EL display element in a case where the corner cube array is used as a retro-reflector when the size of the unit structure of the corner cube array is not less than a dot size of respective colors in the organic EL display element shown in FIG. 1.
Figure 8:
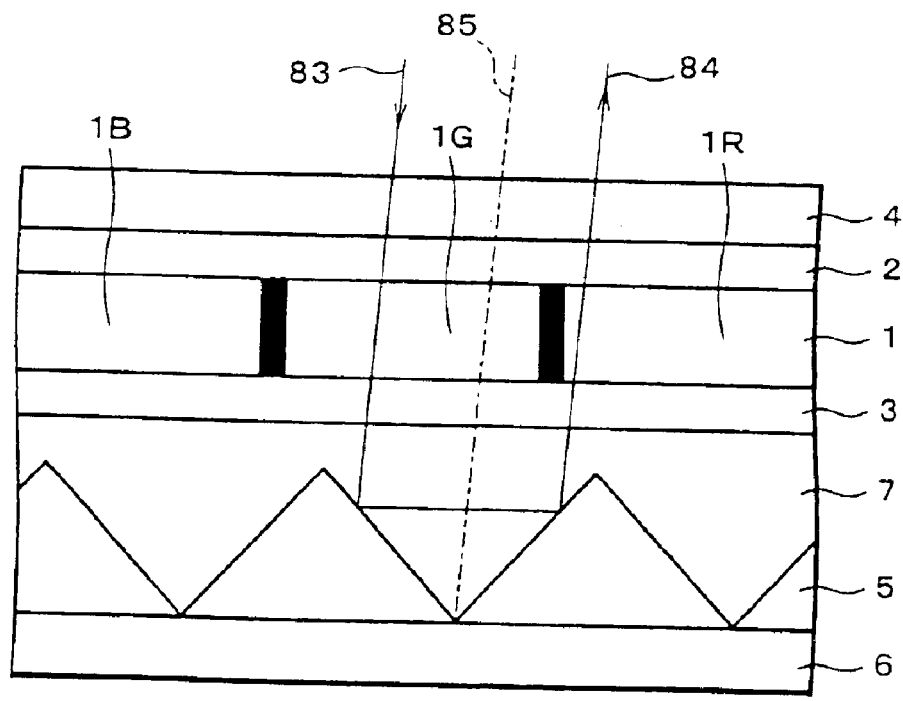
Figure 9:
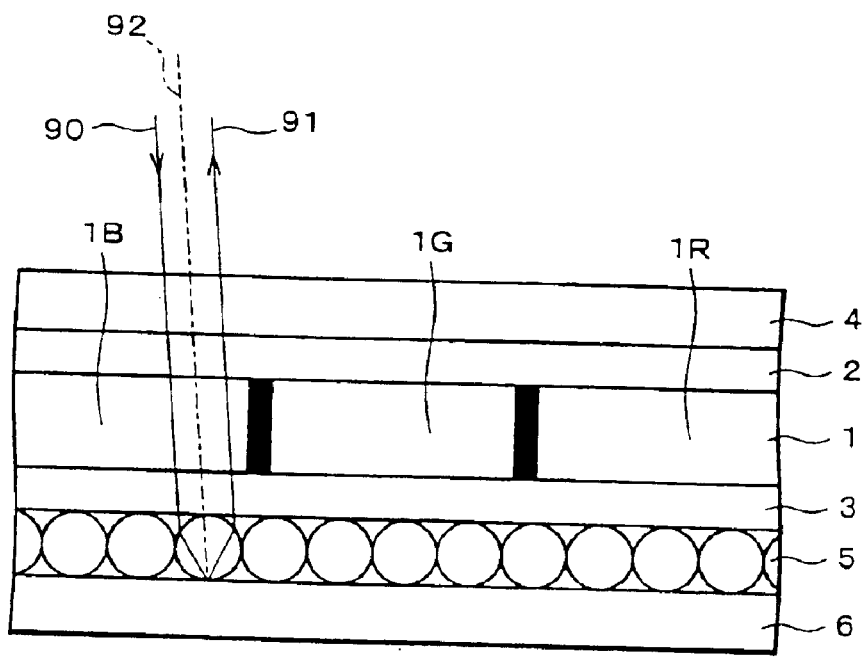
FIG. 9(a) is a cross sectional view showing a structure of the organic EL display element in a case where the corner cube array which includes the micro sphere is used when the size of the unit structure of the retro-reflector is not more than a dot size of respective colors in the organic EL display element shown in FIG. 1.
FIG. 9(b) is a cross sectional view showing a structure of the organic EL display element in a case where a retro-reflector which includes the micro sphere is used when the size of the unit structure of the retro-reflector is larger than a dot size of respective colors in the organic EL display element shown in FIG. 1.
Figure 9:
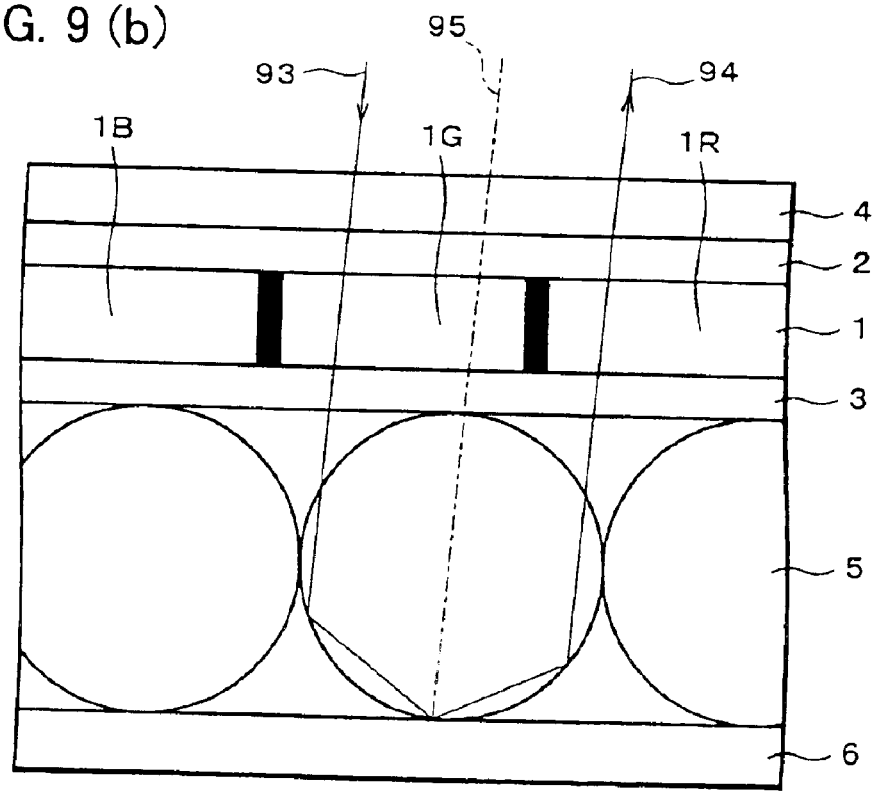

As shown in FIG. 8(*a*) to FIG. 9(*b*), the organic EL layer 1 includes a red organic EL layer 1R which emits red light; a green organic EL layer 1G which emits green light; and a blue organic EL layer 1 which emits blue light. Black matrix layers are provided between the red organic EL layer 1R, the green organic EL layer 1G, and the blue organic EL layer 1B respectively.

FIG. 8(*a*) and FIG. 8(*b*) are cross sectional views showing a structure of the organic EL display element in a case where the corner cube array is used as the retro-reflector 5. FIG. 8(*a*) shows a case where the size of the unit structure of the corner cube array is not more than the size of dots of respective colors. FIG. 8(*b*) shows a case where the size of the unit structure of the corner cube array is larger than the size of dots of respective colors. Note that, the pitch of respective colors, for example, is 100 μm. The size of the unit structure of the corner cube array shown in FIG. 8(*a*), for example, is 25 μm. The size of the unit structure of the corner cube array shown in FIG. 8(*b*), for example, is 120 μm.

As shown in FIG. 8(*a*), the incident light 80 is reflected in the corner cube array to a symmetrical position with respect to a central axis 82. Thereafter, the incident light 80 emerges in the same direction as the incident direction. In this way, the reflected light 81 and the incident light 80 direct so that the reflected light 81 and the incident light 80 are symmetrical with respect to the central axis 82.

For example, in a case where the size of the unit structure of the corner cube array is not more than the size of the dots of respective colors, even when the incident light 80 which passed through the blue organic EL layer 1B is retro-reflected so that the incident light 80 and the reflected light 81 are symmetrical with respect to a central axis 82, the reflected light 81 passes through the blue organic EL layer 1 again.

However, in a case where the size of the unit structure of the corner cube array is larger than the size of the dots of respective colors, as shown in FIG. 8(*b*), when the incident light 83 which passed through the green organic EL layer 1G directs so that the incident light 83 and the reflected light 84 are symmetrical with respect to a central axis 85, the reflected light 84 passes through the red organic EL layer 1R which is next to the green organic EL layer 1G, because the size of the corner cube array is large. In this way, when the size of the unit structure of the corner cube array is larger than the size of the dots of respective colors, color of the organic EL layer 1 through which the incident light passes differs from color of the organic EL layer 1 through which the reflected light passes. Thus, these colors are mixed, so that chroma which can be realized degrade.

In this way, the size of the unit structure of the corner cube array is not more than the size of the dots of respective colors, so that it is possible to prevent mixture of colors in which the incident light which is incident on the corner cube array and the reflected light which emerges from the corner cube array pass through the organic EL layers 1 of different colors. Thus, it is possible to prevent colors from being displayed dully.

Note that, as shown in FIG. 9(*a*) and FIG. 9(*b*), even when the retro-reflector 5 made of the micro spheres is used instead of using the corner cube array as the retro-reflector 5, it is possible to obtain the same effect as the foregoing description. The following is to describe an optical path in the organic EL display element in which the retro-reflector 5 made of the micro spheres is used.

FIG. 9(*a*) and FIG. 9(*b*) are cross sectional views showing a structure of the organic EL display element in which the retro-reflector 5 made of the micro spheres is used. FIG. 9(*a*) shows a case where the size of the unit structure of the retro-reflector 5 is not more than the size of the dots of respective colors. FIG. 9(*b*) shows a case where the size of the unit structure of the retro-reflector 5 is larger than the size of the dots of respective colors.

As shown in FIG. 9(*a*), in a case where the size of the unit structure of the retro-reflector 5 is not more than the size of the dots of respective colors, even when the incident light 90 which passed through the blue organic EL layer 1B is retro-reflected so that the incident light 90 and reflected light 91 are symmetrical with respect to a central axis 92, the reflected light 91 passes through the blue organic EL layer 1B again.

However, in a case where the size of the unit structure of the retro-reflector 5 is larger than the size of the dots of respective colors, when the incident light 93 which passed through the green organic EL layer 1G directs so that the incident light 93 and the reflected light 94 are symmetrical with respect to a central axis 95 as shown in FIG. 9(*b*), the reflected light 93 passes through the red organic EL layer 1R which is next to the green organic EL layer 1G, because the size of the unit structure of the retro-reflector 5 is large. In this way, when the size of the unit structure of the retro-reflector 5 is larger than the size of the dots of respective colors, color of the organic EL layer 1 through which the incident light passes differs from color of the organic EL layer 1 through which the reflected light passes. Thus, these colors are mixed, so that chroma which can be realized degrade.

In this way, the size of the unit structure of the retro-reflector 5 made of the micro spheres is not more than the size of the dots of respective colors, so that it is possible to prevent mixture of colors in which the incident light which is incident on the corner cube array and the reflected light which emerges from the corner cube array pass through the organic EL layers 1 of different colors. Thus, it is possible to prevent colors from being displayed dully.

As described above, the size of the unit structure of the retro-reflector 5 is not more than the dots of respective colors, so that it is possible to prevent mixture of colors. Thus, it is possible to prevent colors from being displayed dully.

Note that, the emission layer which exists between the front side substrate 4 and the back side substrate 6 is not particularly restricted, as long as its state changes between an emission state (first state) and a non-emission state (second state). Thus, the present invention can be applied not only to an organic EL element, but also to a luminous display element such as an FED (field emission display).

Further, a material of the alminium electrode 3 is not restricted to alminium, but it is possible to use any material used as a back plate normally.

As described above, the organic EL display element (luminous display element) of the present invention includes an organic EL layer (emission layer) 1 whose state changes between the first state which is an emission state and the second state which is a non-emission state; and a retro-reflector 5 which reflects the light emitted from the emission layer, and wherein when the emission layer is in the second state, the retro-reflector 5 is adapted to reflect an image of a black part of an observer's eye so as to realize a black state as the observer recognizes the image of the black part of his/her eye.

Thus, in the first state which is the emission state, the light emitted in the organic EL layer 1 can emerge to the front side of the organic EL display element. Thus, it is possible to realize high lightness and good quality in the white state. Further, not only the light emitted to the front side but also the light emitted to the back side in the organic EL layer 1 can emerge, so that it is possible to improve the utilization efficiency of emission.

Further, when the organic EL layer 1 is in the second state, an image of a black part of an observer is reflected by including the retro-reflector 5, and the observer observes the image of the black part, so that it is possible to realize the black state. Thus, it is possible to improve contrast ratio in a display device which uses the organic EL display element.

Further, it is preferable that the pitch of the unit structure of the retro-reflector 5 is not more than ½ of the diameter of the black part of the observer's eye.

By this, it is possible to prevent deterioration of the black state which is influenced by the unit structure of the retro-reflector 5. Thus, it is possible to realize high lightness in the white state and high contrast ratio.

[Second Embodiment]

The second embodiment of the present invention is described as follows based on FIG. 19 to FIG. 24. Note that, components which have the same functions as the components in the first embodiment are given the same numerals, and descriptions thereof are omitted.

Figure 19:
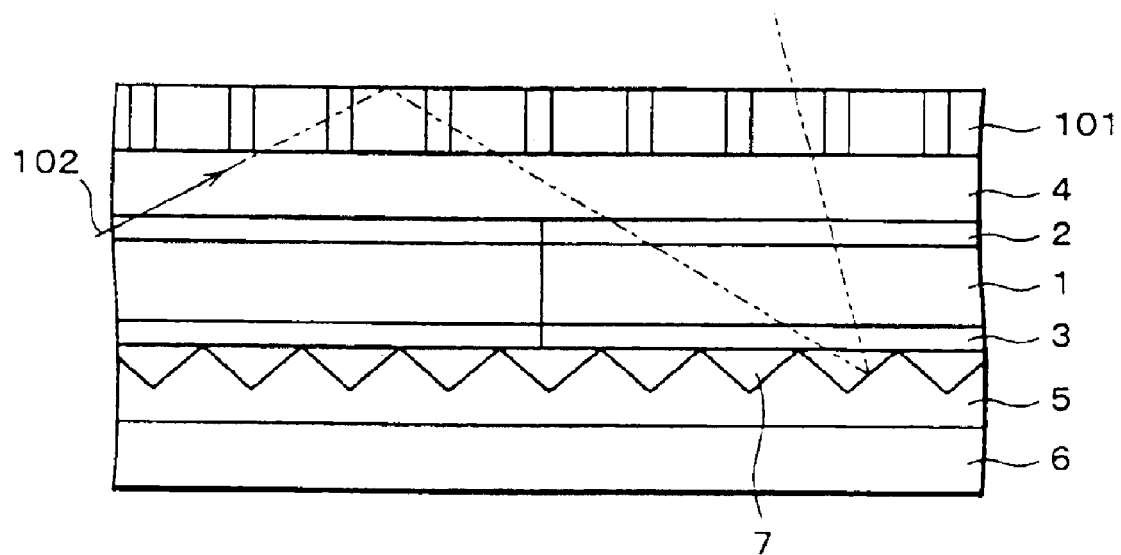
FIG. 19 is a cross sectional view showing a structure of the organic EL display element according to another embodiment of the present invention.

As shown in FIG. 19, an organic EL display element as a luminous display element according to the present embodiment differs from the organic EL display element of the first embodiment in that a louver (first light absorbing member) 101 is provided on the front side substrate 4. Excluding this louver 101, the present embodiment has the same structure as the first embodiment. In the present embodiment, a light control film (Sumitomo 3M products) is used as the louver 101.

The louver 101 allows light in a range of a view angle which is specified according to the size and the use of a screen of the organic EL display element to pass in a direction of thickness of the front side substrate 4 (that is, in a vertical direction with respect to the surface of the front side substrate 4), but is a light absorbing section which absorbs the light passing through different plural dots, and the louver 101 is a light shielding section which shields the light in a predetermined range other than the view angle.

Figure 20:
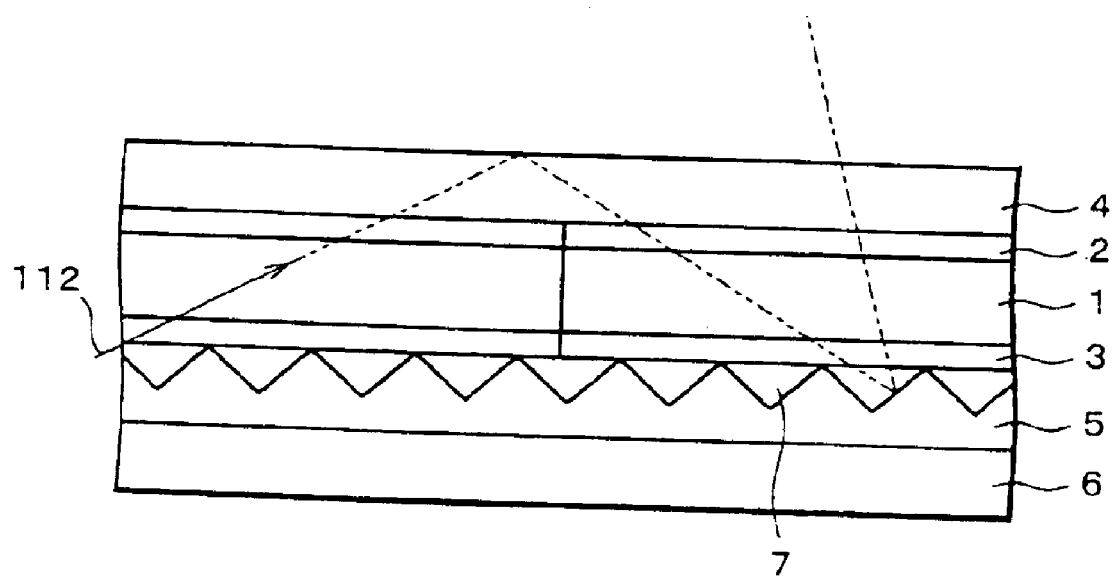
FIG. 20 is a cross sectional view showing a structure in a case where a louver is omitted in the organic EL display element shown in FIG. 19.

As shown in FIG. 20, in the organic EL display element including no louver, a part of the incident light is sometimes incident on other dots as the stray light 112. When the stray light 112 which is guided from other dots is incident on a dot, the stray light 112 is reflected by the retro-reflector 5 in a position of the dot, and emerges to outside of the organic EL display element (outside of the display panel). This allows reflectance of the black state to rise, and causes the black state to deteriorate.

On the other hand, in the organic EL display element having the louver 101, the louver 101 can absorb the stray light 102 which is guided from other dots as shown in FIG. 19. In FIG. 19, a dotted line shows that the stray light 102 is absorbed and does not enter other dots.

In this way, since the louver 101 can absorb the stray light 102 which is guided from other dots, it is possible to prevent other dots from being observed even when an observer observes in a diagonal direction with respect to the screen. Thus, it is possible to realize good quality in the black state. This effect can be seen particularly when the corner cube array is used as the retro-reflector 5.

Figure 21:
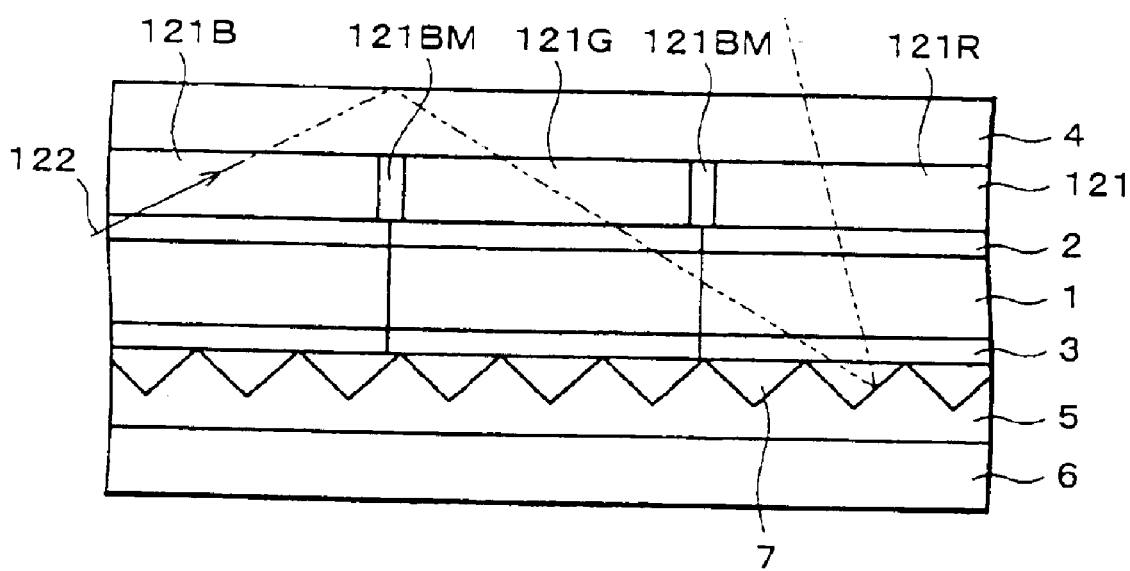
FIG. 21 is a cross sectional view showing a cross sectional view showing a structure in a case where the louver is omitted and color filter layers are formed in the organic EL display element shown in FIG. 19.

As shown in FIG. 21, it is possible to obtain the effect also by using a color filter layer (first light absorbing member) 121 which is provided so as to function as a light absorbing section. That is, the stray light 122 which is guided from other dots is absorbed by a black matrix 121BM, and is substantially attenuated sufficiently by passing through plural color filters 121R, 121G, and 121B, so that it is possible to keep good quality in the black state. Here, a transmission wave length band of the provided color filter layer 121 is set to be substantially equal to an emission wave length band of the organic EL display element.

Next, the following experiment was performed to confirm an effect in a case where the color filters 121R, 121G, and 121B which functioned also as a light absorbing section were provided. Specifically, the experiment was performed by using an organic EL display element which was almost the same as an organic EL display element shown in FIG. 21 and was different from the organic EL display element of FIG. 21 in that the color filters 121R, 121G, and 121B were excluded. In a measuring system shown in FIG. 22, reflecting ratio in the black state was measured when the diffused light was incident on the organic EL display element.

Figure 22:
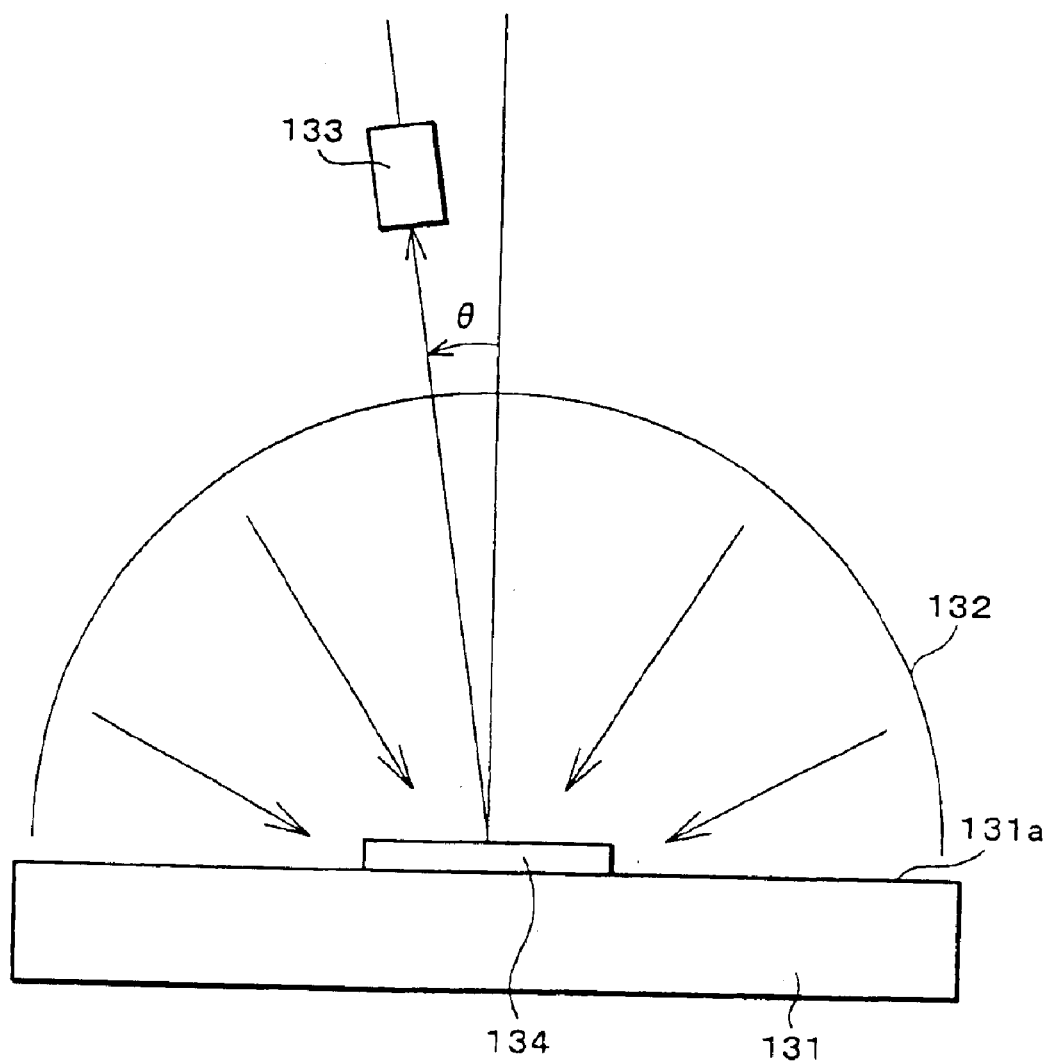
FIG. 22 is an explanatory drawing showing a structure of a measuring system.

The measuring system shown in FIG. 22 includes a measuring base 131, a diffusion plate 132 in a form of a semi-sphere, and a light receiver 133.

The measuring base 131 is provided so that a measuring surface 131a, a top face of the measuring base 131, is kept horizontal. The diffusion plate 132 covers the measuring surface 131a in a form of a semi-sphere, and the light projected from the diffusion plate 132 is irradiated from the all directions of the semi-sphere at equal luminance to the central position of the semi-sphere.

A light receiving polar angle of the light receiver 133 can be changed. The light receiving polar angle is an angle between a line which stretches from the central position of the semi-sphere in a normal direction of the measuring surface 131a and a line which stretches in a direction in which the light receiver 133 is provided. In FIG. 22, the angle is shown by θ.

In the measuring system, a sample 134 is placed in a predetermined position, and the diffusion light is projected by the diffusion plate 132, and a reflection luminance is measured by the light receiver 133. Note that, a perfect reflecting diffusion plate is placed in a position of the sample 134, and reflecting ratio is 100% when the light reflected in a front direction (θ=0°) is received.

Figure 23:
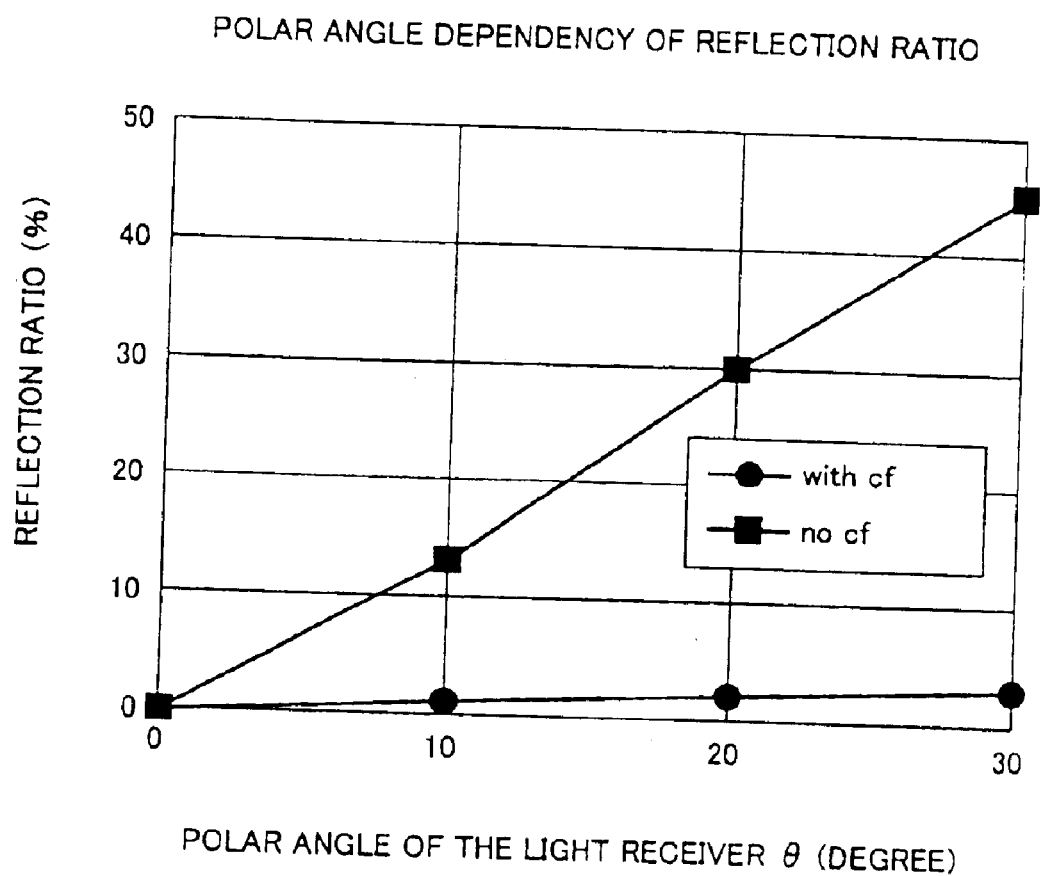
FIG. 23 is a graph showing polar angle dependency of the reflectance in a black state.

A result of the experiment is as shown in FIG. 23. In FIG. 23, no-cf shows the organic EL display element including no color filter layer 121, and with-cf shows the organic EL display element including the color filter layer 121.

In this way, it turned out that, by providing the color filters 121R, 121G, and 121B, the reflectance in the black state is reduced, compared with the organic EL display element including no color filters, even when an observer observes in a diagonal direction (diagonal view angle) with respect to the screen, so that quality in the black state is improved.

As described above, by providing the light absorbing section such as the louver 101 and the color filter layer 121, it is possible to suppress the increase of reflectance in the black state with respect to the observing direction, and to realize good quality in the black state.

Figure 24:
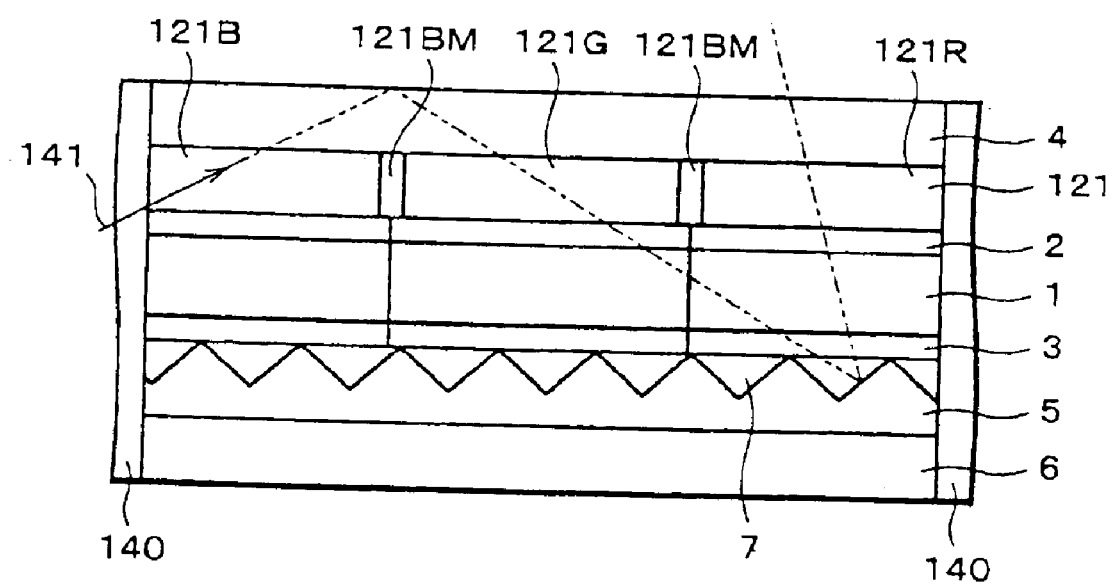
FIG. 24 is a cross sectional view showing a structure in a case where the organic EL display element shown in FIG. 21 includes a light absorbing member on the side face.

Further, as shown in FIG. 24, a side face of the organic EL display element may be covered with a light absorbing member (second light absorbing member) 140. The organic EL display element shown in FIG. 24 differs from the organic EL display element shown in FIG. 21 (the display panel in the organic EL display element) in that the light absorbing member 140 is provided so as to cover the side face of the organic EL display element of FIG. 21.

Since the organic EL display element is provided with the light absorbing member 140 on its side face, the ambient light 141 is prevented from being incident into the display panel. Further, it is possible to prevent the deterioration of the black state which is brought about by the stray light which was guided in the organic EL display element and reached the side face of the display panel. Thus, it is possible to realize good quality in the black state.

Note that, it is preferable that the light absorbing members 140 are provided on all four sides of the display panel (that is, all the sides of a panel-form section formed with the respective substrates 4 and 6). Further, although a material of the light absorbing member 140 is not particularly restricted, it is possible to use the same material as a bezel, the louver 101, or the black matrix 121BM. Further, it is preferable that the light absorbing member 140 is provided so that a low reflective index layer such as the air does not exist between the organic EL display element and the light absorbing member 140.

As described above, it is preferable to provide, on the front side of the retro-reflector 5 in the organic EL display element, the louver 101 and the color filter layer 121 which absorb a non-retro-reflecting component of the light reflected by the retro-reflector 5. Here, the non-retro-reflecting component of the reflected light is the emerging light whose emerging direction is separated from an incident direction of the incident light by much more than 0.5°. This is because the emerging light whose emerging direction has not more than 0.5°, an angle with respect to the incident direction realizes good quality in the black state, when the screen is observed from a front side, away from the screen by 50 cm, in a case where a diameter of a black part of a human's eye is 10 mm.

Thus, it is possible to allow the light in a range of a view angle which is specified according to the size and the use of a screen of the organic EL display element to pass, and to shield the light in a predetermined range other than the view angle.

For example, when the stray light which is guided from other dots is incident on a dot, the stray light is reflected by an optical member in a position of the dot, and emerges to outside of the organic EL display element (outside of the display panel). This causes reflectance in the black state to rise, and causes the black state to deteriorate.

However, the louver 101 and the color filter layer 121 are provided, so that it is possible for the louver 101 and the color filter layer 121 to absorb the stray light which is guided from other dots. Thus, it is possible to improve characteristic of a view angle in the black state. That is, it is possible to prevent other dots from being observed even when an observer observes in a diagonal direction with respect to the screen.

Further, it is preferable to provide the display panel including the organic EL layer 1 and the retro-reflector 5, and to provide the light absorbing member 140 which is provided so as to cover the side face of the display panel and absorbs the incident light.

This prevents the ambient light from being incident into the display panel. Thus, it is possible to absorb a component which is guided in the organic EL display element and becomes the stray light, and to absorb a component which is incident from the side face of the organic EL display element, and to realize good quality in the black state by preventing deterioration of the black state. In this way, for example, it is possible to avoid degrading quality of display of a display device which uses the organic EL display element.

As described above, the luminous display element of the present invention includes, on the back side of the emission layer, an optical member which reflects the incident light in the same direction as the incident direction.

According to the structure, it is possible for the light emitted in the emission layer to emerge to the front side of the luminous display element in an emission state of the emission layer. Thus, it is possible to realize high lightness and good quality in the white state. Further, it is possible to allow not only the light which is emitted in the emission layer toward the front side but also the light which is emitted toward the back side to emerge, so that it is possible to improve the utilization efficiency of emission.

Further, it is possible to reflect the ambient light in the same direction as the incident direction by providing the optical member. This, for example, enables contrast ratio of the display device which uses the luminous display element to be high. Also in a non-emission state, it is possible to reflect the ambient light in the same direction as the incident direction by providing the optical member, so that the ambient light does not emerge in a direction of an observer. Thus, an image is not reflected, so that it is possible to realize good quality in the black state. In this way, it is possible to provide the luminous display element whose contrast ratio is high.

In the luminous display element, it is preferable that the pitch of the unit structure of the optical member is not more than 5 mm.

According to the structure, in a case where it is supposed that the size (diameter) of a black part of an observer's eye is about 10 mm, the pitch (not more than 5 mm) of the unit structure of the optical member is half of the size of the black part, so that upper and lower images of the black part are not reflected. Thus, it is possible to realize good quality in the black state.

Further, in the luminous display element, it is further preferable that the pitch of the unit structure of the optical member is not more than 1 mm.

According to the structure, it is possible to narrow an image observed by an observer in the black state from the black part to the pupil, and it is possible to improve quality in the black state.

It is preferable that, in the luminous display element, the emission layer includes plural colors, and the size of the unit structure of the optical member is not more than the size of the dots of the respective colors.

According to the structure, it is possible to prevent the incident light which is incident on the optical member and the reflected light which is reflected by the optical member from passing through an area of different colors in the emission layer. Thus, it is possible to prevent mixture of colors, so that it is possible to prevent chroma which can be realized from degrading.

In the luminous display element, it is preferable that the optical member includes the corner cube array whose unit structure is in a form of a triangular pyramid which is made up of three rectangular equilateral triangles, and the light shielding process is performed on the periphery of a, base angle of the rectangular equilateral triangles.

According to the structure, it is possible to arrange the optical member by a simple structure. Further, since the light shielding process is performed, the incident light does not emerge in a direction of an observer. Thus, it is possible to prevent an image of the ambient light from being reflected, so that it is possible to provide the luminous display element whose contrast ratio is high.

In the luminous display element, it is preferable that the optical member includes the corner cube array whose unit structure is made up of three squares.

According to the structure, it is possible to arrange the optical member by a simple structure.

In the luminous display element, it is preferable that the optical member includes the corner cube array, and the light shielding process is performed on edges and apices of the corner cube array.

According to the structure, it is possible to absorb a component which is incident on edges such as the edges and the apices of the corner cube array and is reflected irregularly. Thus, it is possible to reduce the reflectance in the black state, and to improve quality in a black state further. Thus, it is possible to provide the luminous display element whose contrast ratio is higher.

In the luminous display element, it is preferable to provide, on the front side of the optical member, the first light absorbing member which absorbs a non-retro-reflecting component of the light reflected by the optical member. Here, the non-retro-reflecting component of the reflected light is the emerging light whose emerging direction is separated from the incident direction of the incident light by much more than 0.5°.

According to the structure, it is possible to allow the light in a range of a view angle which is specified according to the size and the use of a screen of the organic EL display element to pass, and to shield the light in a predetermined range other than the view angle.

For example, when the stray light which is guided from other dots is incident on a dot, the stray light is reflected by an optical member in a position of the dot, and emerges to outside of the luminous display element (outside of the display panel). This causes reflectance in the black state to be increased, and causes the black state to deteriorate.

However, it is possible for the first light absorbing member to absorb the stray light which is guided from other dots by providing the first light absorbing member. Thus, it is possible to prevent other dots from being observed even when an observer observes in a diagonal direction with respect to the screen, and it is possible to realize good quality in the black state.

Specifically, in the luminous display element, it is preferable that the first light absorbing member includes color filter layer.

According to the structure, for example, the stray light which is guided from other dots passes through the black matrix and the plural color filters, so that the stray light is substantially attenuated sufficiently. As a result, it is possible to keep good quality in the black state.

Thus, it is possible to improve characteristic of a view angle in the black state, and it is possible to avoid a loss of the utilization efficiency of emission.

Further, in the luminous display element, it is preferable that the first light absorbing member is made of the louver.

According to the structure, it is possible to positively absorb the non-retro-reflecting component, that is, the component in which the incident light is separated from the reflected light so that they are not parallel with each other, so that it is possible to improve characteristic of a view angle in the black state.

In the luminous display element, it is preferable to provide the display panel including the emission layer and the optical member, and to provide the second light absorbing member which is provided so as to cover the side face of the display panel and absorbs the incident light.

According to the structure, the second light absorbing member can prevent the ambient light from being incident into the display panel. Thus, it is possible to absorb a component which is guided in the organic EL display element and becomes the stray light, and to absorb a component which is incident from the side face of the luminous display element, and to realize good quality in the black state by preventing deterioration in the black state. In this way, for example, it is possible to avoid degrading quality of display of a display device which uses the luminous display element.

In the luminous display element, it is preferable that the emission layer is an electroluminescence layer.

According to the structure, it is possible for the light emitted in the electroluminescence layer to emerge to the front side of the luminous display element in an emission state of the electroluminescence layer. Thus, it is possible to realize high lightness and good quality in the white state. Further, it is possible to allow not only the light which is emitted in the electroluminescence layer toward the front side but also the light which is emitted toward the back side to emerge, so that it is possible to improve the utilization efficiency of emission.

Further, the luminous display element of the present invention includes an emission layer whose state changes between the first state which is an emission state and the second state which is a non-emission state; and a reflecting member which reflects the light emitted from the emission layer, wherein when the emission layer is in the second state, the reflecting member is adapted to reflect an image of a black part of an observer's eye so as to realize a black state as the observer recognizes the image of the black part of his/her eye.

According to the structure, in the first state which is the emission state, the light emitted in the emission layer can emerge to the front side of the luminous display element. Thus, it is possible to realize high lightness and good quality in the white state. Further, not only the light which is emitted to the front side but also the light which is emitted to the back side in the emission layer can emerge, so that it is possible to improve the utilization efficiency of emission.

Further, when the emission layer is in the second state, an image of a black part of an observer's eye is reflected by including the reflecting member, and the observer recognizes the image of the black part, so that it is possible to realize displaying black. Thus, it is possible to improve contrast ratio in a display device which uses the luminous display element.

In the luminous display element, it is preferable that the reflecting member reflects the incident light in the same direction as the incident direction.

According to the structure, the ambient light does not emerge in a direction of an observer. Thus, an image is not reflected, so that it is possible to realize good quality in the black state.

In the luminous display element, it is preferable that the pitch of the unit structure of the reflecting member is not more than ½ of a diameter of a black part of an observer's eye.

According to the structure, it is possible to prevent the deterioration of the black state which is brought about by the unit structure of the reflecting member. Thus, it is possible to realize high lightness in the white state and high contrast ratio.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A luminous display element comprising:
   a retro-reflector;
   an emission layer;
   a metal electrode for applying a voltage to the emission layer; and
   a transparent electrode for applying a voltage to the emission layer,
   wherein the retro-reflector, the metal electrode, the emission layer and the transparent electrode are provided in this order.

2. The luminous display element set forth in claim 1, wherein the metal electrode has a same form as the retro-reflector.

3. The luminous display element set forth in claim 1, wherein the emission layer and the retro-reflector are combined with each other.

4. The luminous display element set forth in claim 1, wherein the metal electrode is an aluminum electrode.

5. The luminous display element set forth in claim 1, wherein the emission layer is an organic electroluminescence layer.

6. The luminous display element set forth in claim 1, wherein:
   the retro-reflector is a corner cube array,
   the metal electrode, the emission layer and the transparent electrode are provided in this order on a slope of a corner cube of the retro-reflector so that the metal electrode retro-reflects an incident light, and
   said luminous display element further comprises a flattening film provided on the transparent electrode.

* * * * *